(12) United States Patent
Namba et al.

(10) Patent No.: US 7,476,895 B2
(45) Date of Patent: Jan. 13, 2009

(54) METHOD OF FABRICATING N-TYPE SEMICONDUCTOR DIAMOND, AND SEMICONDUCTOR DIAMOND

(75) Inventors: Akihiko Namba, Itami (JP); Takahiro Imai, Itami (JP); Yoshiki Nishibayashi, Itami (JP)

(73) Assignee: Sumitomo Electric Industries., Ltd., Osaka (JP)

( * ) Notice: Subject to any disclaimer, the term of this patent is extended or adjusted under 35 U.S.C. 154(b) by 0 days.

(21) Appl. No.: 11/651,502

(22) Filed: Jan. 10, 2007

(65) Prior Publication Data

US 2007/0111498 A1 May 17, 2007

Related U.S. Application Data

(60) Division of application No. 11/013,450, filed on Dec. 17, 2004, now Pat. No. 7,172,957, which is a continuation of application No. PCT/JP03/07717, filed on Jun. 18, 2003.

(30) Foreign Application Priority Data

Jun. 18, 2002 (JP) ............................ P2002-177647
Apr. 2, 2003 (JP) ............................ P2003-099601

(51) Int. Cl.
*H01L 29/04* (2006.01)
*H01L 31/20* (2006.01)
*H01L 31/036* (2006.01)
*H01L 31/0376* (2006.01)

(52) U.S. Cl. .............................. 257/52; 257/49; 257/75

(58) Field of Classification Search ................... 257/49, 257/52, 75, 77
See application file for complete search history.

(56) References Cited

U.S. PATENT DOCUMENTS

| 4,482,422 A | * | 11/1984 | McGinn et al. ................. 117/95 |
| 4,982,243 A | * | 1/1991 | Nakahata et al. ............... 257/77 |
| 5,034,784 A | | 7/1991 | Yamazaki |
| 5,565,724 A | * | 10/1996 | Hachigo et al. .......... 310/313 A |

(Continued)

FOREIGN PATENT DOCUMENTS

EP          865065 A1    9/1998

(Continued)

OTHER PUBLICATIONS

Taiwanese Office Action, with English Translation, issued in corresponding Taiwanese Patent Action No. TW 092116538, issued on Jan. 9, 2008.

(Continued)

*Primary Examiner*—Phuc T Dang
(74) *Attorney, Agent, or Firm*—McDermott Will & Emery LLP

(57) ABSTRACT

An n-type diamond epitaxial layer 20 is formed by processing a single-crystalline {100} diamond substrate 10 so as to form a {111} plane, and subsequently by causing diamond to epitaxially grow while n-doping the diamond {111} plane. Further, a combination of the n-type semiconductor diamond, p-type semiconductor diamond, and non-doped diamond, obtained in the above-described way, as well as the use of p-type single-crystalline {100} diamond substrate allow for a pn junction type, a pnp junction type, an npn junction type and a pin junction type semiconductor diamond to be obtained.

1 Claim, 21 Drawing Sheets

U.S. PATENT DOCUMENTS

| | | | |
|---|---|---|---|
| 5,961,717 | A | 10/1999 | Kamo et al. |
| 6,184,611 | B1 | 2/2001 | Saito et al. |
| 6,267,637 | B1 | 7/2001 | Saito et al. |
| 6,680,900 | B1 | 1/2004 | Takahashi et al. |
| 2002/0031913 | A1 | 3/2002 | Nishibayashi et al. |

FOREIGN PATENT DOCUMENTS

| | | | |
|---|---|---|---|
| EP | 1184885 | A1 | 3/2002 |
| JP | 4139077 | | 5/1992 |
| JP | 9-309794 | A | 12/1997 |
| JP | 10012565 | | 1/1998 |
| JP | 10-312735 | A | 11/1998 |
| JP | 2002-75171 | A | 3/2002 |
| TW | 466777 | B | 12/2001 |
| TW | 471006 | B | 1/2002 |
| TW | 221602 | B | 10/2004 |

OTHER PUBLICATIONS

European Search Report issued in European Patent Application No. EP 03733484.4-1215 PCT/JP0307717, dated Apr. 2, 2008.

* cited by examiner

METHOD OF FABRICATING N-TYPE SEMICONDUCTOR DIAMOND, AND SEMICONDUCTOR DIAMOND

RELATED APPLICATIONS

This application is a divisional of application Ser. No. 11/013,450, filed on Dec. 17, 2004 now U.S. Pat. No. 7,172,957, which is a continuation of International Application No. PCT/JP2003/07717, filed on Jun. 18, 2003, which in turn claims the benefit of Japanese Patent Application No. 2002-177647, filed on Jun. 18, 2002, and Japanese Application No. 2003-099601, filed on Apr. 2, 2003, the disclosures of which Applications are incorporated by reference herein.

FIELD OF THE INVENTION

The present invention relates to a method of fabricating n-type semiconductor diamond; to an n-type semiconductor diamond; to a pn junction type semiconductor diamond; to a pnp junction type semiconductor diamond; an npn junction type semiconductor diamond; and to a pin junction type semiconductor diamond.

BACKGROUND OF THE INVENTION

Great efforts in studies and researches are currently being made to be able to apply a diamond to usages as semiconductor device materials. Semiconductor devices employing diamonds can stably operate even in harsh environments of a high temperature, a space or the like, and can also cope with high-speed high-output operations, resulting in increasing demand.

The applicability of diamonds as semiconductor device materials requires a conductivity type control pertaining to p-type or n-type. P-type semiconductor diamond can be easily obtained for example by introducing a boron-containing chemical compound as impurity source into a chamber during chemical vapor deposition (CVD).

On the other hand, n-type semiconductor diamond, whose synthesis has hitherto been deemed difficult can now be obtained by causing diamond to grow epitaxially on while n-doping with phosphorus the single-crystalline {111} diamond substrate. Further, there has been proposed a diamond UV light emitting element having a pn junction structure, in which a phosphorus-doped n-type semiconductor diamond thin film is laminated on the surface of a boron-doped p-type semiconductor diamond thin film formed on the electrically conductive single crystal {111} diamond substrate (non-patent document 1).

[Non-Patent Document 1]
"NEW DIAMOND," Japan New Diamond Forum, 2001, Vol. 17, No. 4, p. 10-16.

DISCLOSURE OF THE INVENTION

Recently, in view of the use of diamond as a semiconductor device such as a UV light emitting element or the like, both a high quality and a large surface area are required of a single-crystalline substrate available for epitaxial growth.

Since stable idiomorphic planes of a single-crystalline diamond obtained by means of vapor-phase synthesis are {111} or {100}, the application of diamonds as semiconductor device materials has its limitations to a {111} or a {100} orientation in the event of attempting to obtain a single-crystalline diamond thin film by means of homoepitaxial growth.

However, there have been problems that there can be obtained no single-crystalline {111} diamond substrate of high quality and having a large surface area, even using a method of high-pressure synthesis or a method of vapor-phase synthesis. By contrast, using a {111} single-crystal substrate made of cubic boron nitride, iridium, silicon or the like, it is conceivable to adopt a method of causing a single-crystalline diamond thin film to grow heteroepitaxially thereon. However, this method is also, in view of application to semiconductor devices, insufficient in terms of the growth of large-area films or the crystallinity. As another possibility, there can be contemplated a method employing as a substrate a polycrystalline diamond dominantly consisting of {111} crystal planes. However, while this method can be expected to reduce cost and provide a large surface area, adverse influences due to crystal grain boundaries will prevent from obtaining desired device properties.

On the other hand, as for a single-crystalline {100} diamond substrate there can be obtained the one, which is of high quality and has a large surface area, by arranging in a matrix form without any gap therebetween a plurality of high-pressure synthesized single crystal {100} thin plates, which are rectangular slices with several mm-long sides and with a thickness of several hundreds of microns, and by using microwave plasma CVD device capable of applying 60 kW power. However, one problem in this regard is that the n-doping efficiency of an epitaxial layer would be extremely low, and no effective carrier density could be obtained as an electrically conductive diamond, if diamond would be caused to epitaxially grow while doping the single-crystalline {100} diamond substrate.

The present invention has for its object to solve the above problems, and to provide a method of fabricating a large-size high-quality high carrier density n-type semiconductor diamond; an n-type semiconductor diamond; a pn junction type semiconductor diamond; a pnp junction type semiconductor diamond; an npn junction type semiconductor diamond; and a pin junction type semiconductor diamond.

As a result of strong efforts having been made in research and studies to achieve the above object, the present inventor has found that an n-type semiconductor diamond can be preferably obtained using a single-crystalline {100} diamond substrate by forming {111} oriented planes by means of micro-processing of the surface of a single-crystalline {100} diamond substrate and by causing diamond to epitaxially grow while n-doping this single-crystalline {100} diamond substrate.

With further continued strong efforts in research and studies having been made the present inventor has found that a semiconductor diamond having a pn junction, a pnp junction, an npn junction, or a pin junction can be obtained by appropriately combining the above-described n-type semiconductor diamond, p-type semiconductor diamond, and non-doped diamond, or by employing a single crystal p-type semiconductor {100} diamond substrate as a single-crystalline {100} diamond substrate, or the like.

That is, the method of fabricating n-type semiconductor diamond in accordance with this invention comprises the steps of: processing a single-crystalline {100} diamond substrate so as to form diamond {111} planes; and causing diamond to epitaxially grow while n-doping the diamond {111} planes so as to form an n-type diamond epitaxial layer.

According to the invention, there can be obtained a high-quality high carrier density n-type semiconductor diamond, since diamond is caused to epitaxially grow while n-doping diamond {111} planes. Further, a large-area n-type semiconductor diamond can be obtained, since diamond {111} planes are formed based on a large-area single-crystalline {100} diamond substrate rather than a single crystal {111} diamond substrate.

In accordance with the present invention, preferably a diamond triangular protrusion which is triangular in shape of a cross section and extends in one direction, is formed by processing a single-crystalline {100} diamond substrate, the surface of the triangular protrusion consisting of the diamond {111} planes. The formation of the triangular protrusion based on a large-area single-crystalline {100} diamond substrate, allows for large-area diamond {111} planes to be easily formed.

The triangular protrusion portion is preferably formed by processing the surface layer of the single-crystalline {100} diamond substrate so as to form a diamond rectangular protrusion which is rectangular in shape of a cross section and extends in one direction, and subsequently by causing diamond to grow on the rectangular protrusion. This allows for easier formation of a diamond rectangular protrusion with its surface consisting of a {111} plane.

In accordance with the invention, it is preferable to further comprise a step of removing the surface layer of an n-type diamond epitaxial layer up to the top portion of the triangular protrusion. The surface area of a {111} plane decreases as diamond grows epitaxially under the conditions of preferential growth of diamond along the <111> direction on a {111} plane consisting of the surface of the triangular protrusion. After a while, the surface of the epitaxial layer turns into a flat {100} plane, whereupon diamond grows only along the <100> direction. Here, the epitaxial layer which has been n-doped while growing along the <100> direction, exhibits a low carrier density due to a low doping efficiency. In view of this, by removing the surface layer of the epitaxial layer up to the top portion of the triangular protrusion in which a {111} plane previously existed, there can be obtained a diamond, being provided with a {100} plane, and having a maximum surface area of n-type semiconductor with a high-quality as well as high carrier density. Further, as described above, the surface area of a {111} plane decreases and the surface area of a {100} plane increases as diamond grows. The interruption of the growth prior to the occurrence of a perfectly flat {100} leads to a state wherein both a {111} plane and a {100} plane co-exist on the surface. In such a surface, there can be found in a {100} plane a vapor-phase synthesis condition for the epitaxial growth of a high-quality non-doped diamond layer or a high-quality boron-doped p-type diamond layer. In view of this, it is preferable to provide a sep of processing the surface of a {111} plane to obtain a plane precisely parallel to a single crystal {100} substrate by means of polishing so that the entire surface may constitute a {100} plane which is more suitable for device formation.

The rectangular protrusion is preferably formed by subjecting a single-crystalline {100} diamond substrate to CVD or etching. This allows for the rectangular protrusion. to be easily formed.

There exist preferably a plurality of the triangular protrusions, each triangular protrusion being arrayed side-by side without any gap therebetween in a direction orthogonal to the extension direction. If there should be arrayed side-by-side with a gap therebetween a plurality of triangular protrusions with their surface consisting of a {111} plane, then there would be arrayed alternately side-by-side {111} planes and {100} planes alternately on the surface of a single-crystalline {100} diamond substrate. Further, if diamond should be caused to epitaxially grow while n-doping the single-crystalline {100} diamond substrate, then there could be obtained no uniform carrier density n-type semiconductor diamond, because a diamond {111} plane and a diamond {100} plane differ considerably in the doping efficiency. Since an n-type diamond epitaxial layer on the diamond {111} planes has a higher doping efficiency, each triangular protrusion with a surface consisting of a {111} plane, is preferably arrayed side-by-side without any gap therebetween, in order to obtain n-type semiconductor diamond with a high and uniform carrier density.

In accordance with the invention, a quadrangular pyramidal protrusion of a quadrangular pyramidal diamond is preferably formed by processing a single-crystalline {100} diamond substrate, each side face of the quadrangular protrusion consisting of a {111} plane. By forming the quadrangular pyramidal protrusion based on a single-crystalline {100} diamond substrate there can be easily formed a large-area diamond {111} plane. A quadrangular pyramidal recess can replace a quadrangular pyramidal protrusion without any resultant change in working effects.

The quadrangular pyramidal protrusion is preferably formed by etching the surface layer of a {100} single crystal substrate so as to form a diamond columnar protrusion, and subsequently by causing diamond to grown on the columnar protrusion. This allows for a straightforward formation of the quadrangular pyramidal protrusion whose respective side face corresponds to a {100} plane. The quadrangular pyramidal recess can be formed by etching the surface layer of a single crystal {100} diamond so as to form a columnar hole, and subsequently by causing diamond to grow.

In accordance with the invention, it is preferable to comprise a step of removing the surface layer of an n-type diamond epitaxial layer up to the top portion of the quadrangular pyramidal protrusion. The surface area of a {111} plane decreases with diamond growth, when diamond is caused to grow epitaxially on a diamond {111} plane consisting of one of the side faces of the quadrangular pyramidal protrusion, while doping the diamond {111} plane with n-dopant, under the conditions of the preferential growth of diamond along the <111> direction. After a while, the surface of the epitaxial layer attains a state of a transition into a flat {100} plane, and hence diamond grows only along the <100> direction. Here, the epitaxial layer which has been n-doped while growing along the <100> direction, has a low doping efficiency and hence a low carrier density. In view of this, there can be obtained n-type semiconductor diamond having a high-quality and high carrier density by removing the surface layer of the epitaxial layer up to the top portion of the quadrangular pyramidal protrusion in which a {111} plane previously existed. Further, as descried above, the surface area of a {111} plane decreases and the surface area of a {100} plane increases as diamond grows. The interruption of the growth prior to the occurrence of a perfectly flat {100} plane leads to a state wherein both a {111} plane and a {100} plane co-exist on the surface. In such a surface there have been found in a {100} plane a vapor-phase synthesis condition for the epitaxial growth of a high-quality non-doped diamond layer or a high-quality boron-doped p-type diamond layer. Therefore, in order to allow for the whole surface to serve as a {100} plane so that there can be obtained the one which is more suitable for device formation, it is preferable to comprise a step of making the surface of a {100} plane perfectly parallel to the {100} single crystal substrate by means of polishing or the like.

The columnar protrusion or columnar hole can also be formed by applying CVD to the single-crystalline {100} diamond substrate.

There exist preferably a plurality of the quadrangular pyramidal protrusions that are arranged in a matrix form such that the adjacent ones have their lower sides positioned contiguous to each other. If there should be arranged with a gap therebetween a plurality of quadrangular pyramidal protrusions whose respective side face consisting of a {111} plane, then on the surface of the single-crystalline {100} diamond substrate there would be arranged {111} planes and {100} planes alternately. Further, if diamond would be caused to epitaxially grow while n-doping with n-dopant the single-crystalline {100} diamond substrate, then there could be obtained no n-type semiconductor diamond having a uniform carrier density, because a diamond {111} plane and a diamond {100} plane differ significantly in the doping efficiency. Here, since an n-type diamond epitaxial layer on the diamond {111} plane has a higher doping efficiency, in order to obtain a high and uniform carrier density n-type semiconductor diamond, there are preferably arranged without any gap therebetween a plurality of quadrangular pyramidal protrusions whose respective side face consists of a {111} plane, in a matrix form such that adjacent lower sides thereof are positioned contiguous to each other. There exist preferably also a plurality of the quadrangular pyramidal recesses that are arranged in a matrix form such that adjacent upper sides thereof are positioned contiguous to each other. If there would be arranged a plurality of quadrangular pyramidal recesses whose respective side face corresponds to a {111} plane, in a matrix form with a gap therebetween, then there would be arranged diamond {111} planes and diamond {100} planes alternately on the surface of the single-crystalline {100} diamond substrate. In order to obtain a maximum of the surface area of the high doping efficiency n-type diamond epitaxial layer, there are preferably arranged without any gap therebetween a plurality of quadrangular pyramidal recesses with whose respective side face corresponds to a {111} plane, in a matrix form such that adjacent upper sides thereof are positioned contiguous to each other.

According to this invention, n-type dopant preferably includes at least one of: Ia group elements such as lithium, sodium or the like; Vb group elements such as phosphorus, arsenic or the like; VIb group elements such as sulfur, selenium or the like; and VIIb group elements such as chlorine or the like. These elements are doped effectively on diamond, and serve as n-type carriers. Therefore, the n-doping of diamond with these elements allows for a high-quality high carrier density n-type semiconductor diamond to be obtained.

One aspect of an n-type semiconductor diamond according to the invention is that there is formed an n-type diamond epitaxial layer, n-doped, upon diamond {111} planes formed on a single crystal {100} diamond. N-type semiconductor diamond according to the invention has an n-type diamond epitaxial layer, which is epitaxially grown on while n-doping the diamond {111} planes, offers a high doping efficiency, and hence is an excellent semiconductor device material. Further, since the n-type semiconductor diamond according to the invention is fabricated based on a single-crystalline {100} diamond substrate, there can be obtained the one, which has a large surface area.

Here, another aspect of the invention may be that there are formed a plurality of the diamond {111} planes. In this case, there can be obtained a large-area n-type semiconductor diamond, since there can be formed an n-type diamond epitaxial layer which lie astride the plurality of {111} planes.

One aspect of a pn junction type semiconductor diamond according to this invention is that there is formed an n-type diamond epitaxial layer, n-doped, upon a plurality of {111} planes formed on a p-type single crystal semiconductor {100} diamond substrate.

Another aspect of the pn junction type semiconductor diamond according to the invention may be that there is formed an n-type diamond epitaxial layer, n-doped, upon a plurality of diamond {111} planes formed on a single-crystalline {100} diamond substrate; and there is formed a p-type diamond epitaxial layer, p-doped, upon the n-type diamond epitaxial layer.

One aspect of a pnp junction type semiconductor diamond according to this invention is that there is formed an n-doped n-type diamond epitaxial layer upon a plurality of diamond {111} planes formed on a p-type single crystal semiconductor {100} diamond; and there is formed a p-type diamond epitaxial layer, p-doped, upon the n-type epitaxial layer.

One aspect of npn junction type semiconductor diamond according to the present invention is that there is formed a first n-type diamond epitaxial layer, n-doped, upon a plurality of diamond {111} planes formed on a single-crystalline {100} diamond substrate; there is formed a p-type diamond epitaxial layer, p-doped, upon the n-type diamond epitaxial layer; and there is formed a second n-type diamond epitaxial layer, n-doped, upon the p-type diamond epitaxial layer.

One aspect of a pin junction type semiconductor diamond according to the invention is that there is formed a non-doped diamond layer upon a plurality of diamond {111} planes formed on a p-type single crystal {100} diamond substrate; and there is formed an n-type diamond epitaxial layer, n-doped, upon the non-doped diamond layer.

Another aspect of a pin junction type semiconductor diamond according to this invention may be that there is formed an n-type diamond epitaxial layer, n-doped, upon a plurality of diamond {111} planes formed on a single-crystalline {100} diamond substrate; there is formed a non-doped diamond layer upon the n-type diamond epitaxial layer; and there is provided a p-type diamond epitaxial layer, p-doped, upon the non-doped diamond layer.

In the above-described pn junction type semiconductor diamond, pnp junction type semiconductor diamond, npn junction type semiconductor diamond, and pin junction type semiconductor diamond, there is formed an n-type diamond epitaxial layer upon diamond {111} planes, and hence an effective n-doping is achieved. This results in a formation of n-type diamond epitaxial layer of high-quality and with high carrier density. On the other hand, as a substrate there is used a single crystal {100} diamond, and hence there can be obtained a high-quality large-area semiconductor diamond.

N-type semiconductor diamond according to the invention there can be used as, for example, a diamond n-type Schottky diode, a diamond n-type Schottky LED, and a diamond n-type electron emitting element. Further, a pn junction type semiconductor diamond can be used as a diamond pn junction diode, a diamond UV LED (ultraviolet light emitting device), a diamond UV detector, and an electron emitting element having a diamond pn junction structure. Further, a pnp junction type semiconductor diamond and an npn junction type semiconductor diamond can be used as a diamond pn junction diode, a diamond UV LED, and an electron emitting element having a pnp junction structure. Further, a pnp junction semiconductor diamond and an npn junction semiconductor diamond can both be used as a diamond transistor, and an electron emitting element having a diamond pnp junction structure or an npn junction structure. Furthermore, a pin junction type semiconductor diamond can be used as a diamond pin photodiode, a diamond UV LED, and an electron emitting element having a diamond pin junction structure.

In accordance with the present invention, it is preferable that an angle between a {111} plane formed on a single-crystalline {100} diamond substrate on one hand and the substrate surface on the other is within a range of 54.7°±10°. In a single diamond {100} diamond substrate there can occur an offset angle, and in this case there exists a certain range of tolerance for an angle between a {111} plane formed on the substrate and the substrate surface, but with the range of tolerance within the preferred range of angle there is formed a high-quality n-type semiconductor diamond on the {111} plane.

BEST MODE FOR CARRYING OUT THE INVENTION

Figure 1A:
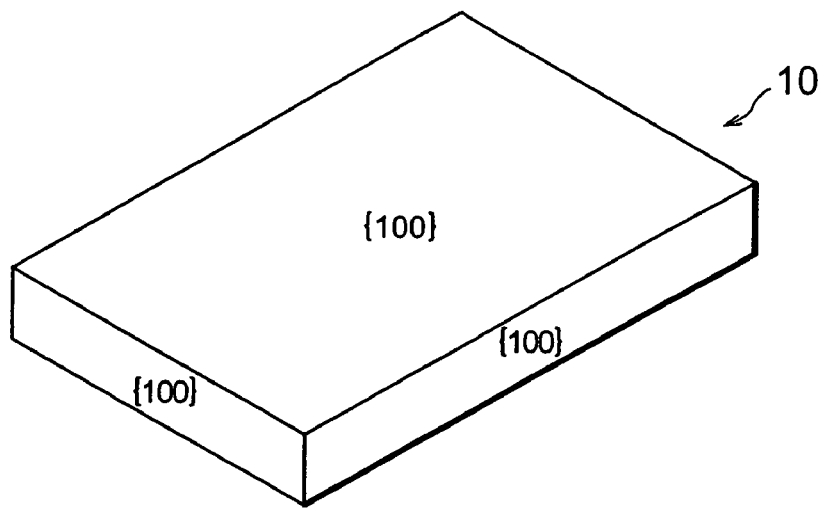
FIGS. 1A, 1B, 1C, and 1D are schematic view showing steps of patterning a single-crystalline {100} diamond substrate.

There will now be described in detail hereinafter preferred embodiments in accordance with the present invention of: a method of fabricating n-type semiconductor diamond; an n-type semiconductor diamond; a pn junction type semiconductor diamond; a pnp junction type semiconductor diamond; an npn junction type semiconductor diamond; and a pin junction type semiconductor diamond. Like reference characters denote similar elements throughout, and overlapping descriptions are omitted.

FIRST EMBODIMENT

Referring to FIGS. 1A-1D and FIGS. 2A-2E, there will be described hereinafter a method of fabricating n-type semiconductor diamond according to a first embodiment. The method of fabricating n-type semiconductor diamond according to the first embodiment involves, generally discussed, obtaining an n-type semiconductor by (1) providing diamond triangular protrusions with their surfaces consisting of {111} planes, upon a single-crystalline {100} diamond substrate, and by (2) forming an n-type diamond epitaxial layer on the triangular protrusions.

First, there is prepared a single-crystalline {100} diamond substrate 10 as shown in a perspective view of FIG. 1A, which has been cut, in terms of crystal orientation, so as to obtain top portion upper face and side faces thereof consisting {100} planes.

Figure 1B:
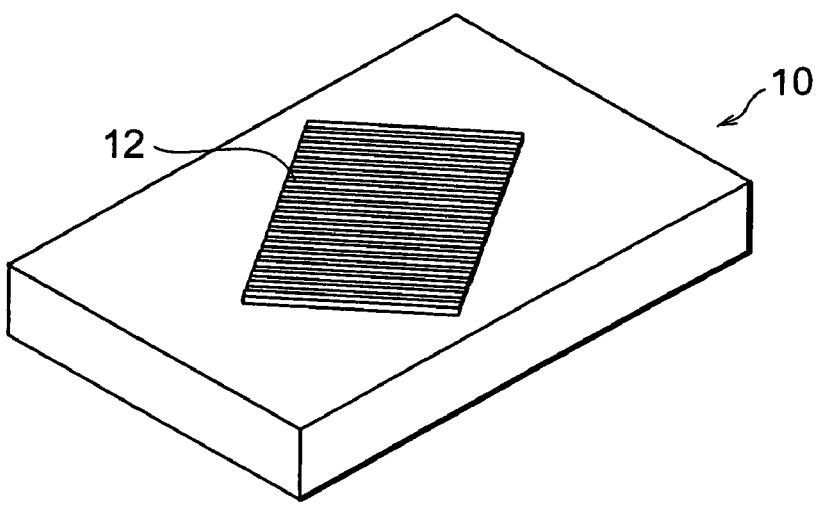
Figure 1C:
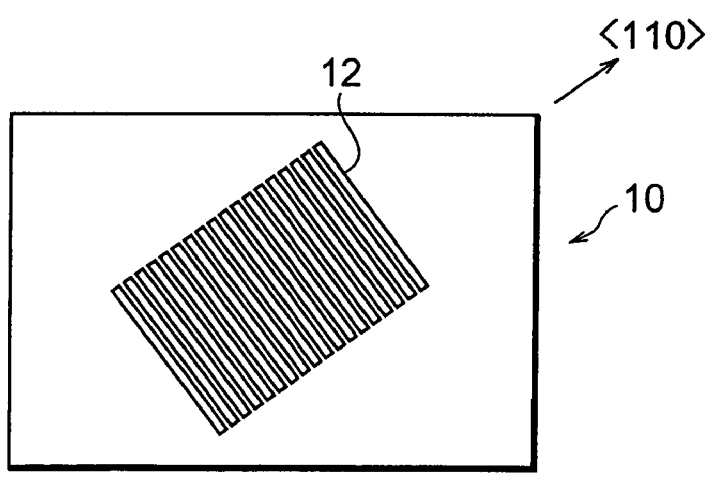
Figure 1D:
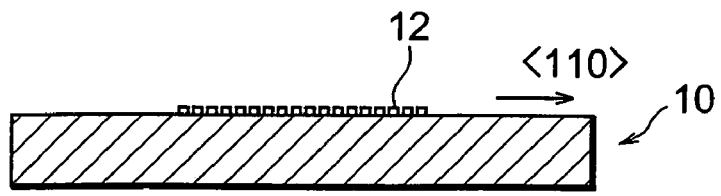

Next, there is formed by means of a photolithography a thin film mask 12, whose pattern is such that lines and spaces are arrayed side-by-side in the <110> direction, equidistantly spaced and alternately, over a part of the surface of the single-crystalline {100} diamond substrate. In FIG. 1C there is shown in a plan view the {100} surface of the single-crystalline {100} diamond substrate patterned with the thin film mask 12. In FIG. 1D there is shown in a cross-sectional view single-crystalline {100} diamond substrate 10 patterned with a thin film mask 12. It is noted that while in this embodiment there is formed a thin film mask with a pattern of lines and spaces arrayed in the <110> direction as shown in the figures, there may be alternatively formed a thin film mask 12 with a pattern of lines and spaces arrayed in a direction perpendicular to the <110> direction. Further, the entire surface of the single-crystalline {100} diamond substrate may be patterned with the thin film mask 12.

Figure 2A:
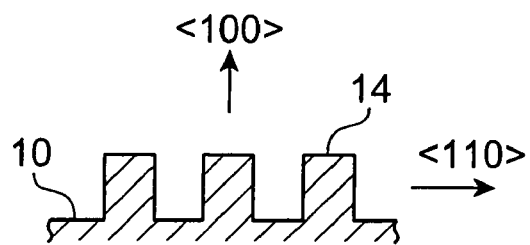
FIGS. 2A, 2B, 2C, 2D, and 2E are schematic view showing an embodiment of a method of fabricating n-type semiconductor diamond in accordance with the present invention.

Still next, the single-crystalline {100} diamond substrate 10, patterned with the thin film mask 12, is transferred to a dry etching device, and is subjected to reactive ion etching. After that, the thin film mask 12 is removed. This causes, as shown in FIG. 2A, a plurality of diamond rectangular protrusions 14 to be formed, which are rectangular in shape in terms of a cross section and extend rearwards in the figure. At this stage, each rectangular protrusion 14 is arrayed in the <110> direction. It is noted that there may be alternatively formed the rectangular protrusions by removing the thin film mask after causing diamond to grow by means of CVD, after the thin mask patterning by means of photolitograph. In this case, a desired formation of the rectangular protrusions by use of the precisely same pattern for the rectangular protrusions 14 formed by etching processing, may be achieved by use of a thin film mask whose line and space pattern is reversed with respect to the thin film mask 12. Further, there may be formed the protrusions 14 also by a combination of a top down-like processing such as etching processing and a bottom up-like processing such as CVD.

Figure 2B:
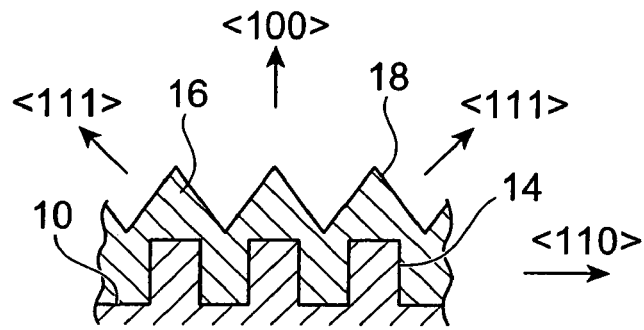

Subsequently, by means of micro-wave plasma CVD apparatus there is achieved growth of a non-doped or undoped diamond layer 16 on the rectangular protrusions 14. This causes, as shown in FIG. 2B, the upper layer of the non-doped diamond layer 16 to grow into triangular protrusions 18 having a {111} surface, being triangular in shape in terms of a cross section and extending rearwards on being viewed in the figure, in such a manner that the rectangular protrusions 14 serve as seeds. At this stage, since there are formed a plurality of the rectangular protrusions 14 that are arrayed side-by-side equidistantly spaced, there are formed a plurality of triangular protrusions that are arrayed side-by-side without any gap therebetween. Each protrusion 18 may be arrayed side-by-side with a gap therebetween. But, this causes diamond {111} planes and diamond {100} planes to be arrayed alternately side-by-side over the surface of the single-crystalline {100} diamond substrate 10. Supposing a diamond should be caused to grow epitaxially while a single-crystalline {100} diamond substrate being doped, then there could be obtained no uniform carrier density n-type semiconductor, because a diamond {111} plane and a diamond {100} plane differ considerably in the doping efficiency. Since the n-type diamond epitaxial layers 20a on diamond {111} planes exhibit higher doping efficiency, it is preferable that there are arrayed side-by-side without any gap therebetween the triangular protrusions 18 with their surfaces consisting of {111} planes in order to obtain a high and uniform carrier density n-type semiconductor diamond. Among the CVD methods for coating an epitaxial diamond there can be mentioned (1) the one to activate raw material by discharge effected by means of DC or AC field; (2) the one to activate raw material by heating thermoelectron emitting materials; (3) the one to apply ion bombardment to the surface upon which diamond is caused to grow; and (4) the one to activate raw gas material by means of light such as laser or the like, etc.

Because the non-doped or uridoped diamond layer 16 is the one whereon the growth is caused so as to form a diamond {111} plane on the rectangular protrusions, the growth should be achieved under the growth condition enabling the formation of the {111} plane. Provided: the growth rate of diamond along the <100> direction on the rectangular protrusions 14 is $V_A <100>$; and the growth rate along the <111> direction is $V_A<111>$, there is, for the purpose of the formation of a {111} plane, a need to cause diamond to epitaxially grow under the growth condition satisfying the following relation of formula:

$$\frac{V_A <100>}{V_A <111>} \times \sqrt{3} > 3 \qquad \text{[formula 1]}$$

Further, provided the relation is satisfied, there is no need to keep to the non-doped or undoped diamond growth condition enabling the formation of a {111} plane. For example, in place of the non-doped diamond, a nitrogen-doped diamond may be caused to grow. It may be also possible to form a {111} plane by causing growth of a nitrogen-doped diamond layer using microwave plasma CVD device, where there exist the growth conditions as follows: hydrogen gas flow rate of 0.1 l/min (100 sccm); methane gas flow rate of $4\times10^{-3}$ l/min (4 sccm); hydrogen-diluted nitrogen gas ($N_2$ 1%) flow rate of $5\times10^{-3}$ l/min (5 sccm); pressure of $1.3\times10^4$ Pa; microwave power of 300 W; and substrate temperature of 870° C. It is noted that while nitrogen provides n-dope diamond, its donor level is significantly low at around 1.7 eV with respect to the diamond band gap (approximately 5.5 eV), and hence substantially not activated. Moreover, a doping amount of nitrogen under the condition does not exceed 10 ppm, so permitting electric properties of a nitrogen-doped diamond to be regarded substantially same as a non-doped diamond.

Next, there is formed by means of a microwave plasma CVD device a phosphorus-doped diamond layer 20 (n-type diamond epitaxial layer) by causing diamond to grow epitaxially on while there being n-doped with phosphorus the single-crystalline {100} diamond substrate 10 as a base, where a plurality of triangular protrusions 18 with their surfaces consisting of {111} planes are arrayed side-by-side. Here, as n-type dopant, in addition to phosphorus, sulfur, lithium, sodium, nitrogen, arsenic, chlorine, selenium or the like can be used.

To obtain a phosphorus-doped diamond layer 20 by causing it to grow homoepitaxially while doping the triangular protrusion 18 with its surface consisting of a {111} plane, one needs to carry out, this coating under the conditions of the preferential growth of a {111} plane rather than a {100} plane so as to enable coating the {111} planes with homoepitaxial diamond. Then, to achieve the preferential growth of a {111} plane rather than a {100} plane, the following growth condition must be satisfied:

$$\frac{V_B <100>}{V_B <111>} \times \sqrt{3} < 1.5 \qquad \text{[formula 2]}$$

wherein it is assumed that there exist the conditions as follows: the growth rate of diamond on the <100> direction on the triangular protrusions 18 is $V_B<100>$; and the growth rate along the <111> direction is $V_B<111>$.

Further, it is preferable to satisfy the following growth conditions.:

$$\frac{V_B <100>}{V_B <111>} \times \sqrt{3} < 1 \qquad \text{[formula 3]}$$

Figure 2C:
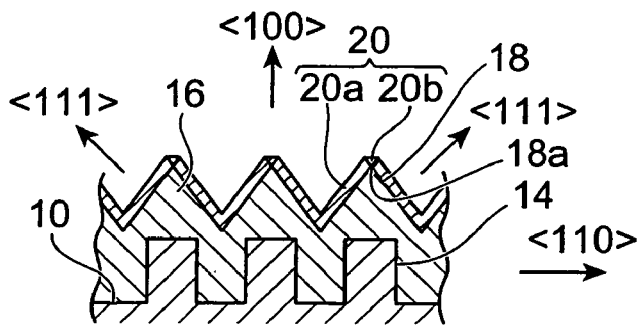
Figure 2D:
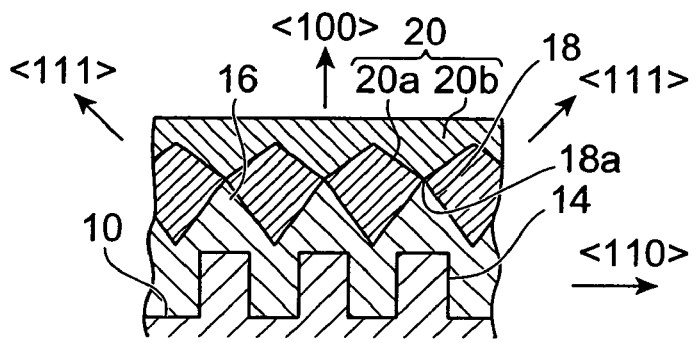

When there is caused the phosphorus-doped diamond layer to grow on the triangular protrusions 18 under the above conditions, diamond grows preferentially along the <111> direction. Therefore, as shown in FIG. 2C, the surface area of {111} planes decreases with diamond growth. After a while, as shown in FIG. 2D, the surface of the phosphorus-doped diamond layer 20 comes to constitute a flat {100} plane, whereupon the n-type semiconductor diamond according to the present invention is obtained.

According to the invention, since there is caused epitadial growth of diamond while there being n-doped the diamond {111} plane, there can be provided a high-quality high carrier density n-type semiconductor diamond. Further, since there are formed diamond {111} planes starting from the large-area single-crystalline {100} diamond substrate 10, there can be provided a large-size n-type semiconductor diamond. According to the method of fabricating n-type semiconductor diamond of the present embodiment, since there can be fabricated an n-type semiconductor diamond based on an inexpensive, mass-producible single-crystalline {100} diamond substrate 10, it is possible to cope with mass-production and cost-reduction.

Figure 2E:
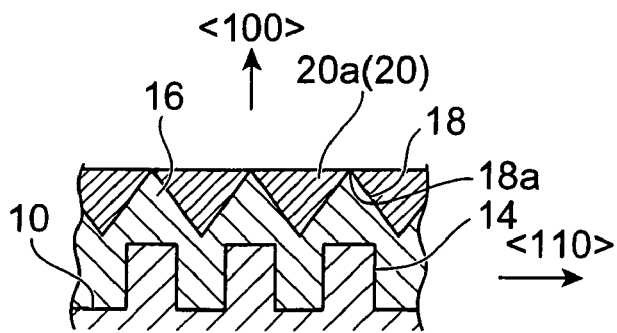

Further, in this embodiment, by removing the surface layer of the phosphorus-doped diamond layer 20, there may be employed as a surface the part having a high n-doping efficiency. As shown in FIGS. 2C and 2D, the achievement of growth of a phosphorus-doped diamond layer 20 on a triangular protrusion 18, could lead to the formation of a <111>growth sector 20a and a <100> growth sector 20b. Here, a <111> growth sector 20a refer to the part which has grown from the surface of a triangular protrusion 18 along the <111> direction. On the other hand, a <100> growth sector 20b refer to the part which has grown from the top portion 18a of the triangular protrusion 18 along the <100> direction. Among the two, <100> growth sector 20b has a low n-doping efficiency. In view of this, as shown in FIG. 2E, by use of reactive ion etching or polishing or the like, there is removed the surface of the phosphorus-doped diamond layer 20 up to the top portion 18a of the triangular protrusion 18 previously having had a {111} plane thereon. This enables the achievement of a diamond with a maximum surface area of a high-quality high carrier density n-type semiconductor, and, moreover, this causes the surface of the diamond to become a flat {100} plane parallel to the surface of a single crystal {100} substrate, and hence there is achieved a structure suitable for device formation. In view of the fact that there should be employed a {100} plane in order to obtain a structure suitable for device formation, there is to be preferred a technique wherein there is caused the surface to be flattened by polishing and the like at the point of time when the diamond has been grown to the extent of such a shape that there is achieved a configuration which is in between the configurations of FIGS. 2C and 2D, and both {100} planes and {111} planes co-exist on the surface thereof.

In the embodiment, there are formed a plurality of {111} planes on the surface of the single-crystalline {100} diamond substrate 10 by forming triangular protrusions 18. This causes the formation of a large-area phosphorus-doped diamond layer 20, extending over a plurality of {111} planes, and further, this allows {111} planes to acquire effectively larger surface areas, as compared with a single-crystalline {111} diamond substrate having the same surface area as the single-crystalline {100} diamond substrate with a plurality of {111} planes formed on the surface thereof. Further, in the case of a triangular protrusion 18, as compared with a quadrangular-pyramidal protrusion, each {111} plane can acquire a large surface area so allowing the surface of the substrate 10 to be constituted by a small number of {111} planes. This enables a creation of n-type semiconductor diamond with a good crystallinity. The triangular protrusion 18 enables has a better fabrication efficiency pertaining to an n-type semiconductor diamond, and hence practical, on the one hand for the reason why there can be obtained n-type semiconductor diamond having a large volume of the n-type semiconductor diamond portion, and on the other hand for the reason why in the case of a triangular protrusion 18 it has been found that the growth rate is accelerated by the reentrant angle effect, although a further desired achievement of epitaxial growth of an n-type semiconductor diamond on {111} planes, presupposes an introduction of the conditions of extremely slow growth rate. That is, as for an n-type semiconductor diamond epitaxial layer, there can be obtained a higher growth rate with the growth on a reentrant-angled plane rather than in the case by the use of a flat plane.

Further, there is formed a triangular protrusion 18 by causing diamond to epitaxially grow on a rectangular protrusion 14 formed by micro-processing the surface layer portion of the single-crystalline {100} diamond substrate 10. This enables easier formation of a diamond triangular protrusion 18 with its surface consisting of a {111} plane. However, alternatively there may be directly formed a triangular protrusion 18 by micro-processing the surface layer portion of the single-crystalline {100} diamond substrate. Alternatively, there may be also directly formed a triangular protrusion 18 by vapor-phase synthesis rather than micro-processing of the single-crystalline {100} diamond substrate.

Further, there exist a plurality of the triangular protrusions 18, each triangular protrusion being arrayed side-by-side without any gap therebetween in a direction orthogonal to the extension direction thereof. Since this causes {111} planes to be arrayed side-by-side without any gap therebetween on the single-crystalline {100} diamond substrate, there can be obtained a high and uniform carrier density n-type semiconductor diamond. Here, the array pitch (that is, the distance between adjacent ridgelines each other) of the triangular protrusions 18 is preferably not more than 15 µm, more preferably 1-50 µm. Further, the height of the triangular protrusions 18 is preferably not more than 100 µm, more preferably 1-35 µm.

SECOND EMBODIMENT

There will now be described a method of fabricating n-type semiconductor diamond according to a second embodiment with reference to FIGS. 3A-3D and FIGS. 4A-4E. The method of fabricating n-type semiconductor diamond according to the second embodiment involves, generally discussed, obtaining an n-type semiconductor diamond by (1) forming a diamond quadrangular-pyramidal protrusion with its respective side face corresponding a {111} plane on a single-crystalline {100} diamond substrate, and by (2) forming an n-type diamond epitaxial layer on the quadrangular-pyramidal protrusion.

Figure 3A:
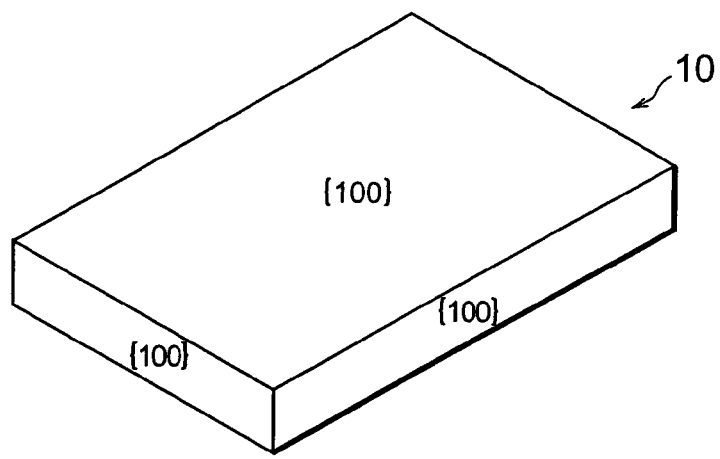
FIGS. 3A, 3B, 3C, 3D are schematic view showing a step of forming a plurality of quadrangular pyramidal protrusions on the single-crystalline {100} diamond substrate.

First, there is prepared, as shown in a perspective view of FIG. 3A, a single-crystalline {100} diamond substrate 10 that has been cut such that the orientations of the upper face and side faces thereof are {100}.

Figure 3B:
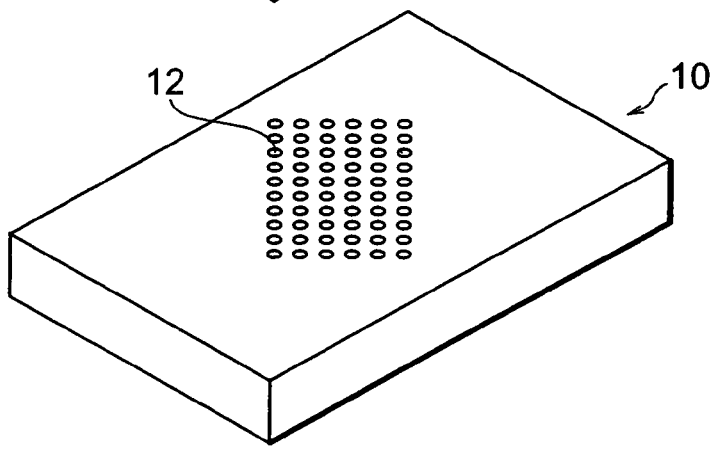

Next, as shown in FIG. 3B, there are formed by means of photolithography a plurality of circular thin film masks 12 in a matrix form on the surface of the single-crystalline {100} diamond substrate. It is noted that there may be patterned the masks 12 over the entire surface of the single-crystalline {100} diamond substrate.

Figure 3C:
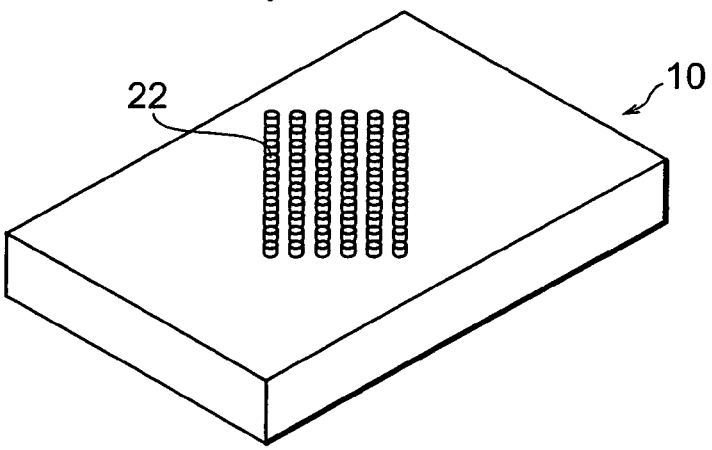
Figure 4A:
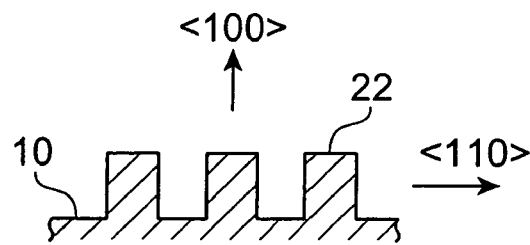
FIGS. 4A, 4B, 4C, 4D, and 4E are schematic view showing an embodiment of a method of fabricating n-type semiconductor diamond according to the invention.

Next, the single-crystalline {100} diamond substrate patterned with the circular thin film masks 12 is transferred to dry etching device, and is subjected to reactive ion etching. After that, the thin film masks 12 are removed. This causes, as shown in FIG. 3C, a plurality of cylindrical protrusions (columnar protrusions) 22 to be formed, arranged in a matrix form, on the surface of the single-crystalline {100} diamond substrate. FIG. 4A shows, in a cross section, the surface layer of the single-crystalline {100} diamond substrate 10 where there are formed a plurality of cylindrical protrusions 22. It is noted that there may be formed the cylindrical protrusions by removing the thin film masks after causing diamond to epitaxially grow on the single-crystalline {100} diamond substrate 10 by means of CVD, after the patterning by means of photolithography. At this stage, there can be formed the cylindrical protrusions with the same pattern as that of cylindrical protrusions 22, by using the thin film masks whose pattern is reversed with respect to that of the thin film masks 12. Further, there may be formed the cylindrical protrusions 22 by a combination of a top down-like processing such as etching processing and a bottom up-like processing such as CVD.

Figure 3D:
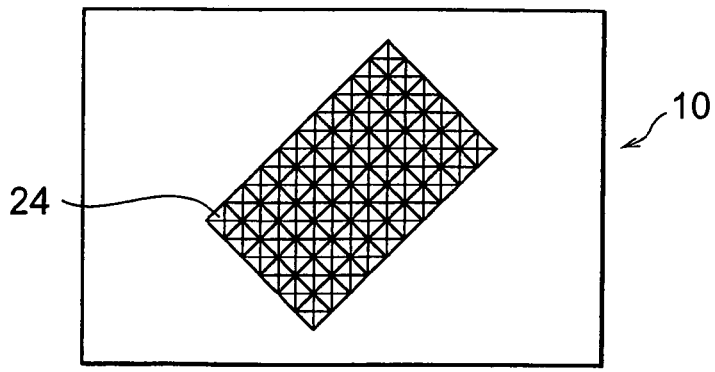
Figure 4B:
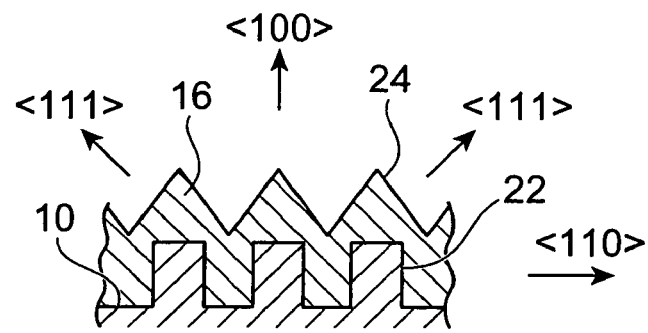

Subsequently, there is achieved growth of a non-doped diamond layer 16 on the cylindrical protrusions 22 using a microwave plasma CVD device. This causes, as shown in FIG. 4B in a cross section, the upper layer portion of the non-doped diamond layer 16 to become quadrangular-pyramidal protrusions 24 with their respective side consisting of a {111} plane, in such a manner that the cylindrical protrusions 22 serve as seed. It is noted that the cylindrical protrusion 22 can be replaced by another columnar protrusion such as polygonal-pyramidal protrusion or the like provided it is capable of serving as seed for forming a quadrangular-pyramidal protrusion 24. FIG. 3D shows, in a plane view, the single-crystalline {100} diamond substrate 10 when the quadrangular-pyramidal protrusions 24 are formed. Since, as shown in FIG. 3C, there are arranged a plurality of cylindrical protrusions 22 in a matrix form, each adjacent quadrangular-pyramidal protrusion 24 is arranged in a matrix form such that the lower sides of adjacent quadrangular-pyramidal protrusions 24 are contiguous to each other. There may be arranged with a gap therebewteen each quadrangular-pyramidal protrusion. However, this causes diamond {111} planes and diamond {100} planes to be arrayed side-by-side alternately on the surface of the single-crystalline {100} diamond substrate. Supposing there would be achieved epitaxial growth of diamond on while n-doping the single-crystalline {100} diamond substrate, then there could be obtained no n-type semiconductor diamond with a uniform doping efficiency, because a diamond {111} plane and a diamond {100} plane exhibit significantly different doping efficiency. Further, since the doping efficiency of the n-type semiconductor diamond epitaxial layer 20 on a diamond {111} plane is the higher one, to obtain a high and uniform carrier density n-type semiconductor diamond, it is preferable that there are arranged without any gap therebetween a plurality of quadrangular-pyramidal protrusions 24 with their surfaces consisting of {111} planes such that adjacent lower sides thereof are positioned contiguous to each other. Here, the condition for causing epitaxial growth of diamond pertaining to the cylindrical protrusions 22 is the same as that for causing epitaxial growth of diamond pertaining to the rectangular protrusions 14 in the first embodiment.

Figure 4C:
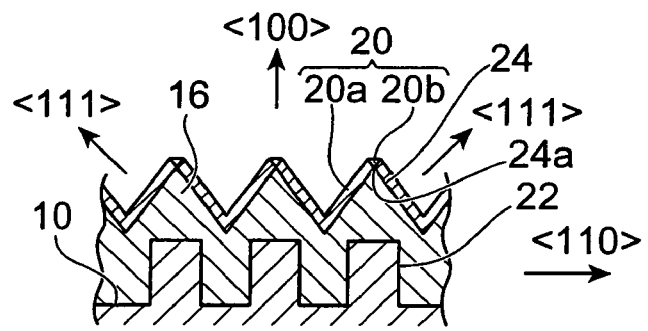

Next, as shown in FIG. 4C, based on the single-crystalline {100} diamond substrate as underlying material wherein there are arrayed side-by-side a plurality of quadrangular pyramidal protrusions 24 with their surfaces consisting of {111} planes, there is formed a phosphorus-doped diamond layer 20 (n-type diamond epitaxial layer) by causing diamond to epitaxially grow while n-doping with phosphorus the single-crystalline {100} diamond substrate 10, using microwave plasma CVD device. Here, as n-type dopant, in addition to phosphorus, sulfur, lithium, sodium, nitrogen, arsenic, chlorine, selenium or the like can be used.

To obtain a phosphorus-doped diamond layer 20 by causing it to homoepitaxially grow on the quadrangular pyramidal protrusions 24 with their surfaces consisting of {111} planes, one needs to carry out, with a view to coating a {111} plane with an epitaxial diamond, this coating under the conditions of the preferential growth of a {111} plane rather than a {100} plane. Here, the condition for causing diamond to grow on the quadrangular pyramidal protrusions 24 is the same as that for causing diamond to grow on the triangular protrusions 18 in the first embodiment.

Figure 4D:
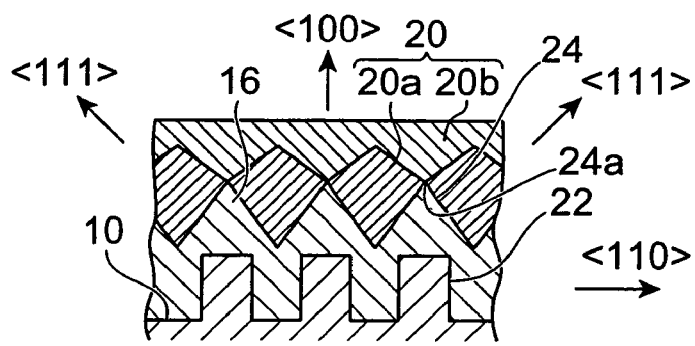

When there is achieved growth of the phosphorus-doped diamond layer 20 on the quadrangular pyramidal protrusions 24 under the condition, diamond grows preferentially along the <111> direction. Therefore, as shown in FIG. 4C, the surface area of {111} planes decreases with diamond growth. After a while, as shown in FIG. 4D, the surface of the phosphorus-doped diamond layer 20 comes to constitute a flat {100} plane, whereupon an n-type semiconductor diamond is obtained.

According to this embodiment, As is the case with the first embodiment, because there is caused diamond to grow epitaxially while there being n-doped the diamond {111} planes, there can be provided a high-quality high carrier density n-type semiconductor diamond. Further, since there is formed a diamond {111} plane based on a large-area single-crystalline {100} diamond substrate 10, there can be provided a large-area n-type semiconductor diamond.

Figure 4E:
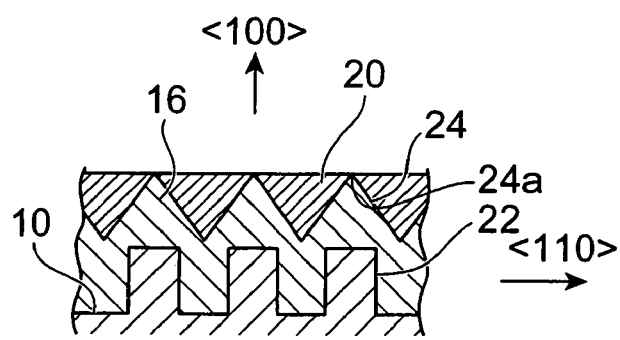

Further, in the embodiment, by removing the surface layer of the phosphorus-doped diamond layer 20, there may be employed as a surface the portion where the n-doping efficiency is high. As shown in FIGS. 4C and 4D, the achievement of growth of a phosphorus-doped diamond layer 20 on a quadrangular pyramidal protrusion 24, could lead to a formation of a <111> growth sector 20a and a <100> growth sector 20b. Here, a <111> growth sector refers to the portion grown along the <111> direction from the surface of the quadrangular pyramidal protrusion 24. Further, a <100> growth sector 24b refer to the portion grown along the <100> direction from the top portion of the quadrangular pyramidal protrusion 24. Among the two, the <100> growth sector 20b has a low n-doping efficiency. Here, as shown in FIG. 4E, using reactive ion etching or polishing or the like, there is removed the surface of the phosphorus-doped diamond layer 20 up to the top portion of the quadrangular pyramidal protrusion 24 previously having had a {111} plane thereon. This allows a diamond having a maximum surface area of a high-quality higher carrier density n-type semiconductor to be obtained, and, moreover, this causes the surface of the diamond to become a flat {100} plane parallel to the surface of a single crystal {100} substrate, and hence there is achieved a structure suitable for device formation. In view of the fact that there should be employed a {100} plane in order to obtain a structure suitable for device formation, there is to be preferred a technique wherein there is caused the surface to be flattened by polishing and the like at the point of time when the diamond has been grown to the extent of such a shape that there is achieved a configuration which is in between the configurations of FIGS. 4C and 4D, and both {100} planes and {111} planes co-exist on the surface thereof.

In the embodiment, there are formed a plurality of {111} planes on the surface of the single-crystalline {100} diamond substrate 10 by forming a quadrangular pyramidal protrusion 24. This causes a large-area phosphorus-doped diamond layer 20 to be formed, which extends over a plurality of {111} planes, and further, a {111} plane can obtain an effectively large surface area as compared with a single crystal {111} diamond substrate having the same surface area as the single-crystalline {100} diamond substrate with a plurality of {111} planes on its surface. Further, in the case of a quadrangular pyramidal protrusion 24, the formation of thin film masks 12 on the single-crystalline {100} diamond substrate, does not require alignment of the directions of lines within the substrate, which on the contrary is required to form a triangular protrusion 18. This enables easier formation of a plurality of {111} planes on the surface of the single-crystalline {100} diamond substrate. Regarding a quadrangular pyramidal protrusion 24, since it is found that the growth rate is increased due to the reentrant angle effect, the fabrication efficiency of an n-type semiconductor diamond is also high in the case of a quadrangular pyramidal protrusion 24, and hence practical.

Further, there is formed a quadrangular pyramidal protrusion 24 by causing diamond to grow on a cylindrical protrusion 22 that has been formed by micro-processing the surface layer portion of the single-crystalline {100} diamond substrate 10. This enables easier formation of a diamond quadrangular pyramidal protrusion 24 with its surface consisting of a {111} plane. It is noted that alternatively there may be formed the quadrangular pyramidal protrusions 24 by micro-processing the surface layer portion of the single-crystalline {100} diamond substrate. Alternatively, there may be directly formed a quadrangular pyramidal protrusion 24 by vapor-phase synthesis rather than micro-processing of the single-crystalline {100} diamond substrate.

Further, there exist a plurality of quadrangular pyramidal protrusions 24, and adjacent quadrangular pyramidal protrusions 24 are arrayed side-by-side in a matrix form such that adjacent lower sides thereof are positioned contiguous to each other. This causes a plurality of {111} planes to be without any gap therebetween arrayed side-by-side on the surface of the single-crystalline {100} diamond substrate 10, and hence there can be obtained a high and uniform density n-type semiconductor diamond. Here, the array pitch (a distance between adjacent peak points) of the quadrangular pyramidal protrusions 24 is preferably not more than 150 μm, more preferably 1-50 μm. Further, the height of the quadrangular pyramidal protrusions 24 is preferably no more than 100 μm, more preferably 1-35 μm.

In the foregoing, there has been described a preferred embodiment of an n-type semiconductor diamond according to this invention. By applying the above-described idea of forming an n-type diamond epitaxial layer on a plurality of {111} planes formed on the single-crystalline {100} diamond substrate, there can be conveniently formed further a pn junction type semiconductor diamond, a pnp junction type semiconductor diamond, an npn junction type semiconductor diamond, and a pin junction type semiconductor diamond.

For example, by forming further a p-type diamond epitaxial layer on the n-type semiconductor diamond as shown in FIG. 2C or FIG. 4C, there can be obtained a pn junction type semiconductor diamond. Further, by forming an n-type diamond epitxial layer on the pn junction type semiconductor diamond with a plurality of {111} planes formed on its surface, there can be obtained an npn junction type semiconductor diamond. Further, by forming a non-doped diamond epitaxial layer on the n-type semiconductor diamond as shown in FIG. 4C, and by forming a p-type diamond epitxial layer on the non-doped diamond epitaxial layer, there can be obtained a pin junction type semiconductor diamond.

Alternatively, using as a substrate a single crystal p-type semiconductor {100} diamond substrate having a plurality of {111} planes formed on its surface so as to form an n-type diamond epitaxial layer on the substrate, there can be also obtained a pn junction type semiconductor diamond. Further, by forming a p-type diamond epitaxial layer on the pn junction type semiconductor diamond, there can be obtained a pnp junction type semiconductor diamond. Further, by forming a non-doped diamond epitaxial layer on the single crystal p-type semiconductor {100} diamond having a plurality of {111} planes formed on its surface, and by forming an n-type diamond epitaxial layer on the non-doped epitaxial layer, there can be obtained a pin junction type semiconductor diamond. There will be described hereinafter specific embodiments pertaining to the pn junction type semiconductor diamond, the pnp junction type semiconductor diamond, the npn junction type semiconductor diamond, and the pin junction type semiconductor diamond.

Figure 6A:
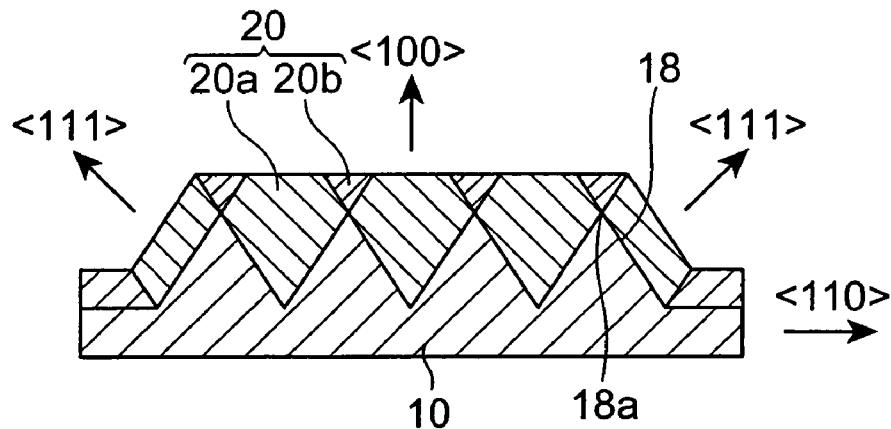
FIGS. 6A, 6B, and 6C are depictions of a constructional example of an n-type semiconductor diamond in accordance with the invention.
Figure 6B:
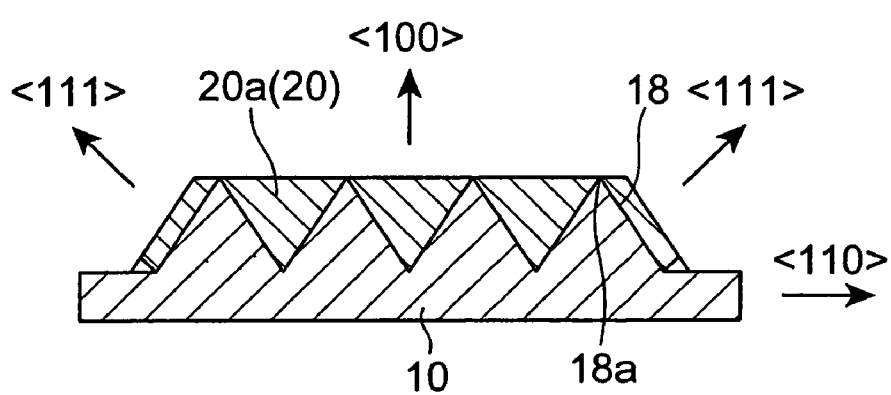
Figure 6C:
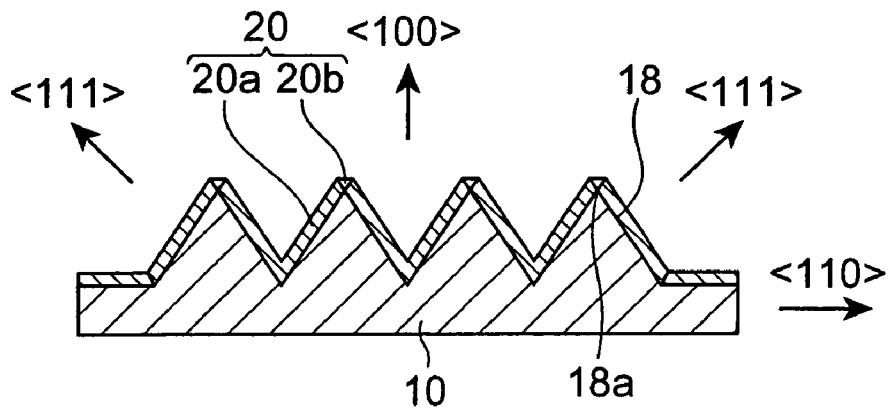

FIGS. 6A-6C show a constructional example of an n-type semiconductor diamond in accordance with the invention. In each figure there is shown an n-type diamond epitaxial layer 20 formed on the triangular protrusion 18 formed on the single-crystalline {100} diamond substrate 10. In FIG. 6A, the surface of the epitaxial layer forms a flat configuration consisting of a plane parallel to the {100} plane of the substrate 10, and positioned higher than the top portion 18a of the triangular protrusion 18. Further, there are exposed a <111> growth sector 20a and a <100> growth sector 20b on the surface of the epitaxial layer 20. In FIG. 6B, the surface of the epitaxial layer forms a flat configuration consisting of a plane parallel to the {100} plane of the substrate 10. Further, there is exposed only the <111> growth sector 20a on the epitaxial layer 20. In FIG. 6C, the surface of the epitaxial layer 20 forms a configuration having a plurality of {111} planes similar to the surface of the substrate 10. The plurality of these {111} planes are the ones, which are constituted by the <111> growth sector 20a. On the other hand, the surface. of the epitaxial layer 20 has a {100} plane constituted by the <100> growth sector 20b grown from the top portion 18a of the triangular protrusion 18. It is noted that in FIGS. 6A-6C, the triangular protrusion 18 may be replaced by the quadrangular pyramidal protrusion 24.

Figure 7A:
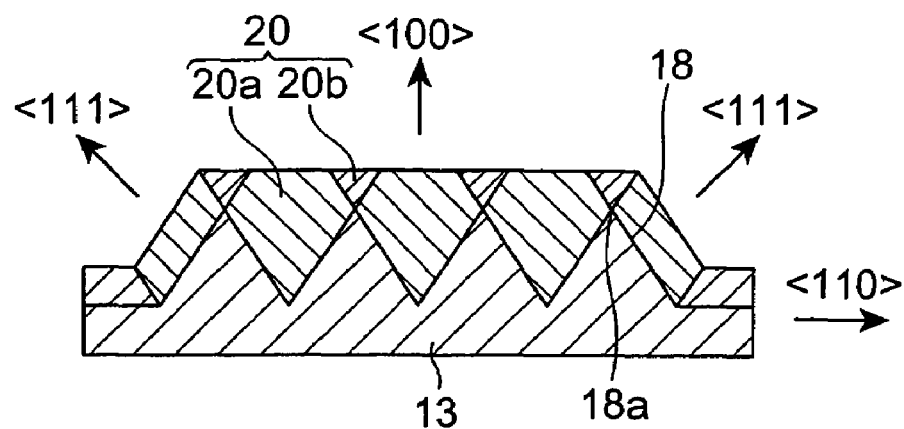
FIGS. 7A, 7B, and 7C are depictions of a constructional example of a pn junction type semiconductor diamond according to the invention.
Figure 7B:
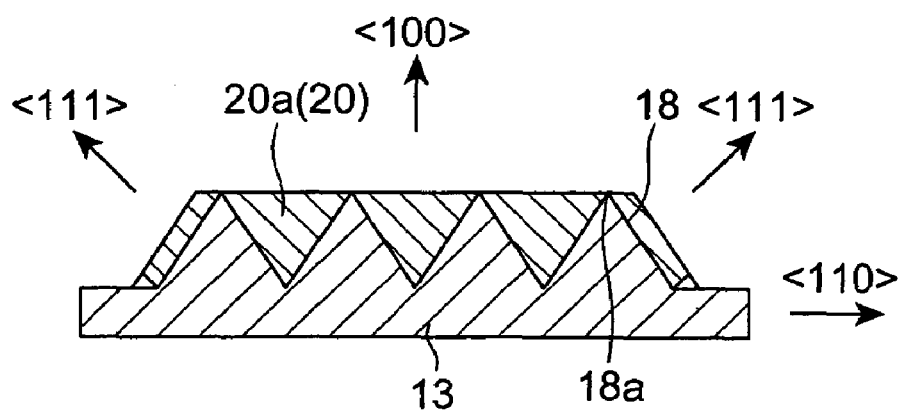
Figure 7C:
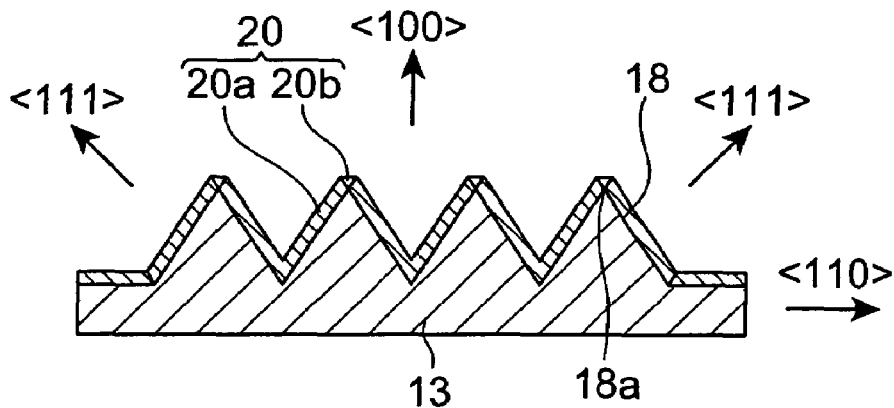

FIGS. 7A-7C show a constructional example of a pn junction semiconductor diamond according to the invention. In each figure, there is shown the n-type diamond epitaxial layer 20 on the triangle protrusion 18 formed on the single crystal p-type semiconductor {100} substrate 13. A structure will be later discussed of the p-type semiconductor {100} diamond substrate. As shown in FIG. 7A, the surface of the eptaxial layer 20 is of a flat configuration constituted by a plane parallel to the {100} plane of the substrate 13, and is positioned higher than a top portion 18a of the triangular protrusion 18. Further, on the surface of the epitaxial layer 20 there are exposed both the <111> growth sector 20a and the <100> growth sector 20b. As shown in FIG. 7B, the surface of the epitaxial layer 20 is of a flat configuration constituted by a plane parallel to the {100} plane of the substrate 13, and is positioned at the location approximately equal in height to the top portion 18a. Further, on the surface of the epitaxial layer 20 there is exposed only the <111> growth sector 20a. As shown in FIG. 7C, the surface of the epitaxial layer 20 is of a configuration having a plurality of {111} planes similar to the surface of the substrate 13. The plurality of these {111} planes are the ones, which are constituted by the <111> growth sector 20a grown on the triangular protrusion 18. On the other hand, the triangular protrusion 18 as shown in FIGS. 7A-7C can be replaced by the quadrangular pyramidal protrusion 24.

Figure 8A:
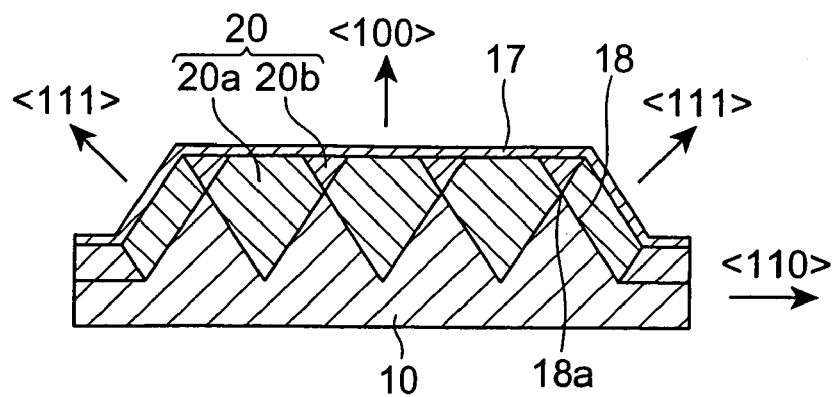
FIGS. 8A, 8B, 8C, and 8D are depictions of a constructional example of a pn junction type semiconductor diamond according to the invention.
Figure 8B:
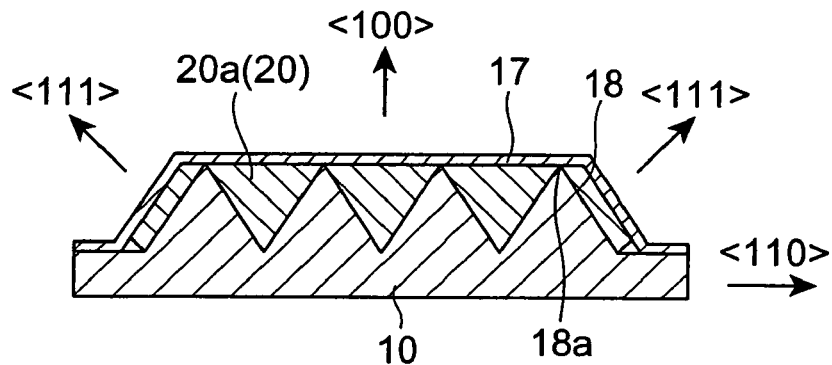
Figure 8C:
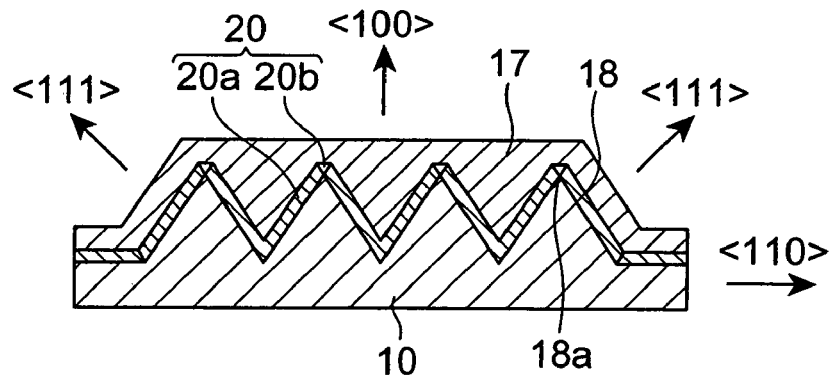
Figure 8D:
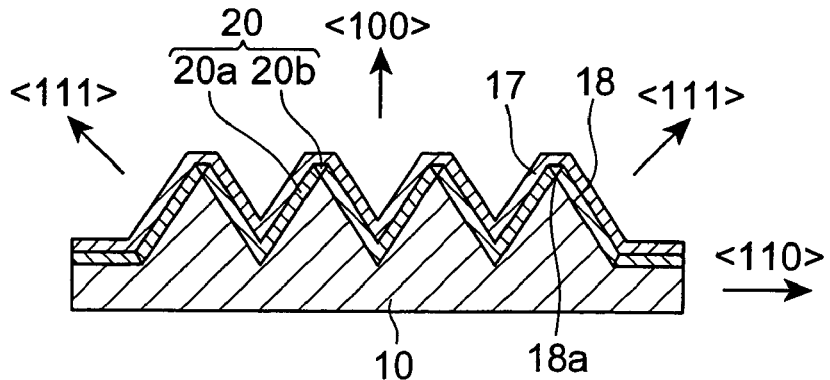

FIGS. 8A-8D show a constructional example of a pn junction type semiconductor diamond according to the invention. The pn junction type semiconductor diamond as shown in FIGS. 8A and 8B are the ones, in which the p-type diamond epitaxial layer 17 is formed on the n-type diamond epitaxial layer 20 of the respective n-type semiconductor diamond as shown in FIGS. 6A and 6B, respectively. In FIGS. 8A and 8B both, the surface of the p-type diamond epitaxial layer 17 is of a flat configuration constituted by a plane parallel to the {100} plane of the substrate 10. The pn junction type semiconductor diamonds as shown in FIGS. 8C and 8D are both the ones, in which the p-type diamond epitaxial layer 17 is formed on the n-type diamond epitaxial layer 20 of the n-type semiconductor diamond as shown in FIG. 6C. In FIG. 8C, the surface of the p-type diamond epitaxial layer 17 is of a flat configuration constituted by a plane parallel to the plane {100} of the substrate 10, and is positioned higher than the surface of the n-type diamond epitaxial layer 20. In FIG. 8D, the surface of the p-type diamond epitaxial layer 17 is of a configuration having a plurality of {111} planes similar to the surface of the substrate 10. The plurality of these {111} planes are the ones, which are constituted by the p-type diamond epitaxial layer 17 grown from the <111> growth sector 20a along the <111> direction. On the other hand, the surface of the p-type diamond epitaxial layer 17 has a {100} plane constituted by the p-type diamond epitaxial layer 17 grown from the surface of the <100> growth sector 20b along the <100> direction. It is noted that in FIGS. 8A-8D the triangular protrusion 18 may be replaced by the quadrangular pyramidal 20 protrusion 24.

Figure 9A:
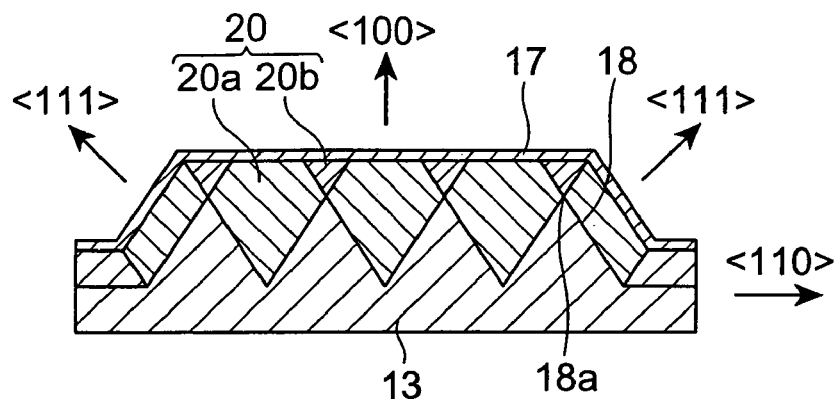
FIGS. 9A, 9B, 9C, and 9D are depictions of a constructional example of an npn junction type semiconductor diamond according to the invention.
Figure 9B:
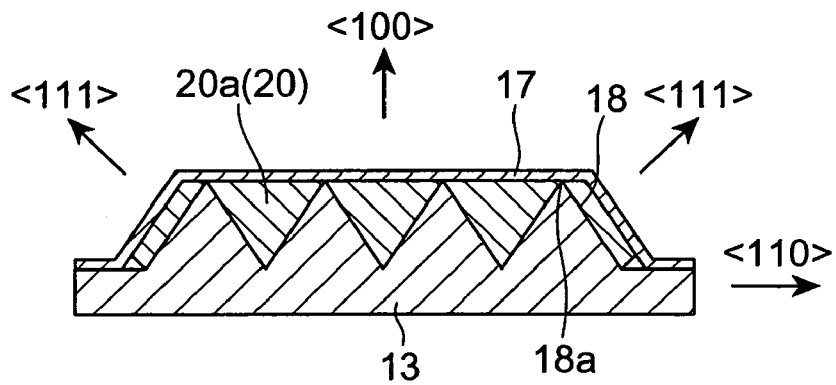
Figure 9C:
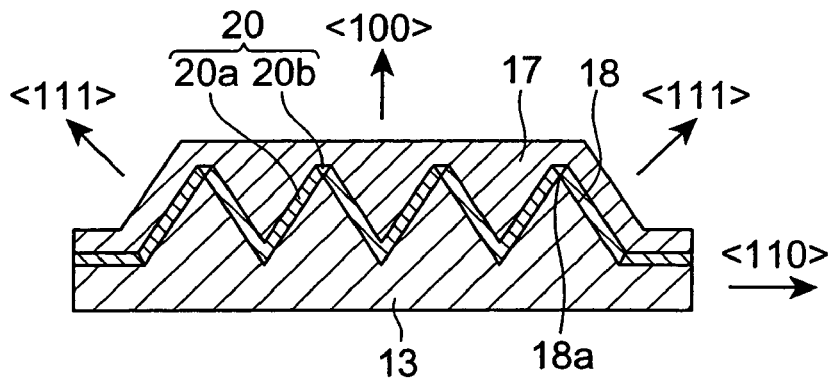
Figure 9D:
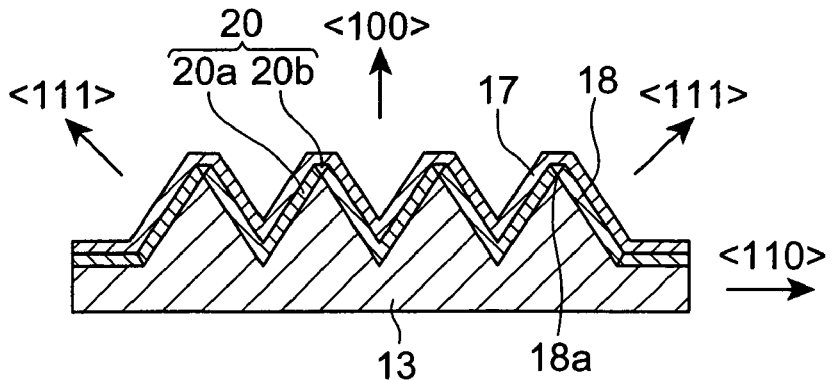

FIGS. 9A-9D show a constructional example of a pnp junction type semiconductor diamond according to the present invention. The pnp junction type semiconductor diamonds as shown in FIGS. 9A and 9B are the ones, in which the p-type diamond epitaxial layer 17 is formed on the n-type diamond epitaxial layer 20 of the pnp junction type semiconductor diamonds as shown in FIGS. 7A and 7B, respectively. In FIGS. 9A and 9B, the surfaces of the p-type diamond epitaxial layers 17 are both of a flat configuration constituted by a plane parallel to the {100} plane of the substrate 13. The pnp junction type semiconductor diamonds as shown in FIGS. 9C and 9D are both the ones, in which the p-type diamond epitaxial layer 17 is formed on the n-type diamond epitaxial layer 20 of the pn junction type semiconductor diamond as shown in FIG. 7C. In FIG. 9C, the surface of the p-type diamond epitaxial layer 17 is of a flat configuration constituted by a plane parallel to the {100} plane of the substrate 13, and is positioned higher than the surface of the n-type diamond epitaxial layer 20. In FIG. 9D, the surface of the p-type diamond epitaxial layer 17 is of a configuration having a plurality of {111} planes similar to the surface of the substrate 13. It is noted that in FIGS. 9A-9D the triangular protrusion 18 may be replaced by the quadrangular pyramidal protrusion 24.

Figure 10A:
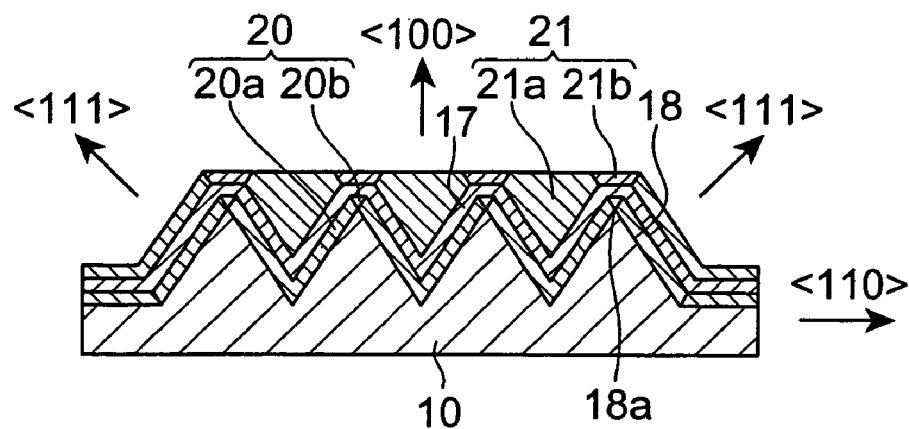
FIGS. 10A and 10B are depictions of a constructional example of an npn junction type semiconductor diamond according to the invention.
Figure 10B:
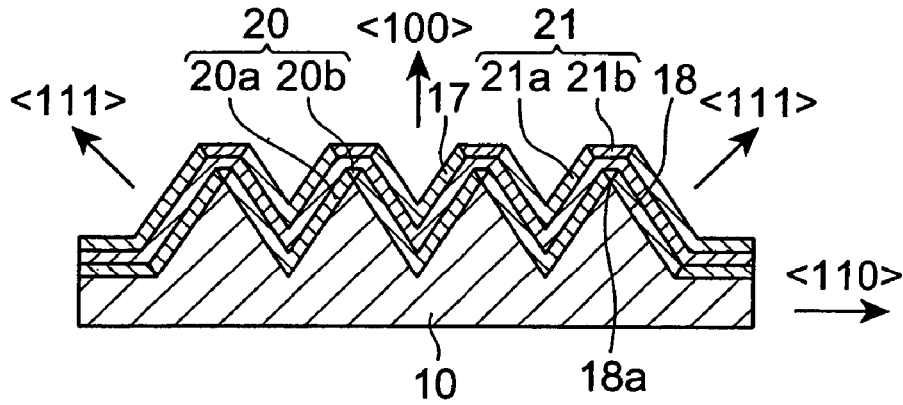

FIGS. 10A and 10B show a constructional example of the npn junction type semiconductor diamond according to the invention. The npn junction type semiconductor diamonds as shown in FIGS. 10A and 10B are both the ones, in which further the n-type diamond epitaxial layer 21 is formed on the p-type diamond epitaxial layer 17 of the pn junction type semiconductor diamond as shown in FIG. 8D. In FIG. 10A, the surface of the n-type diamond epitaxial layer 21 is of a flat configuration constituted by a plane parallel to the {100} plane of the substrate 10, and is positioned higher than the surface of the p-type diamond epitaxial layer 17. Further, on the surface of the epitaxial layer 21 there are exposed both the <111> growth sector 21a and the <100> growth sector 21b. In FIG. 10B, the surface of the n-type diamond epitaxial layer 21 is of a configuration having a plurality of {111} planes similar to the surface of the substrate 10. The plurality of these {111} planes are the ones, which are constituted by the <111> growth sector 21a grown on the {111} planes of the p-type diamond epitaxial layer 17. On the other hand, the surface of the n-type diamond epitaxial layer 21 has a {100} plane constituted by the <100> growth sector 21b grown from the {100} plane of the p-type semiconductor epitaxal layer 17. It is noted that in FIGS. 10A and 10B the triangular protrusion 18 may be replaced by the quadrangular pyramidal protrusion 24.

Figure 11A:
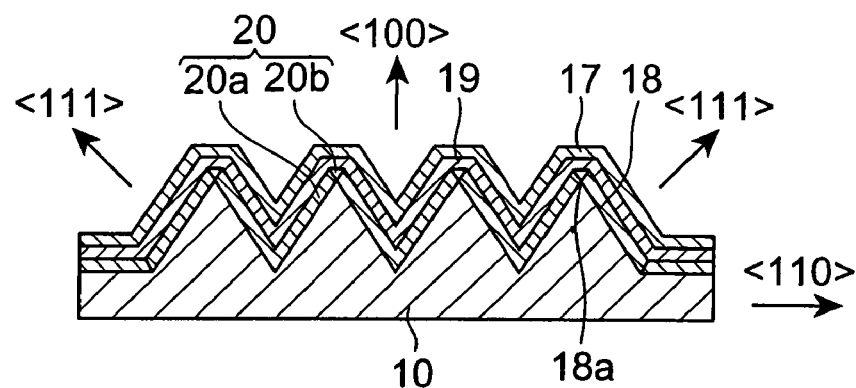
FIGS. 11A, 11B, 11C, and 11D are depictions of a constructional example of a pin junction type semiconductor diamond according to the invention.
Figure 11B:
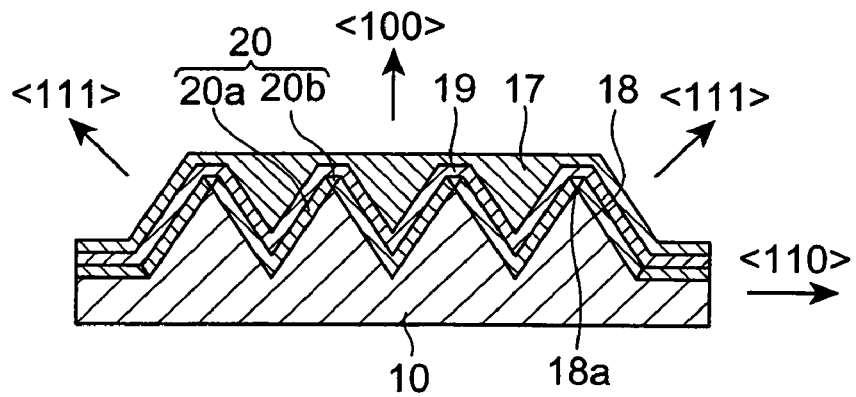
Figure 11C:
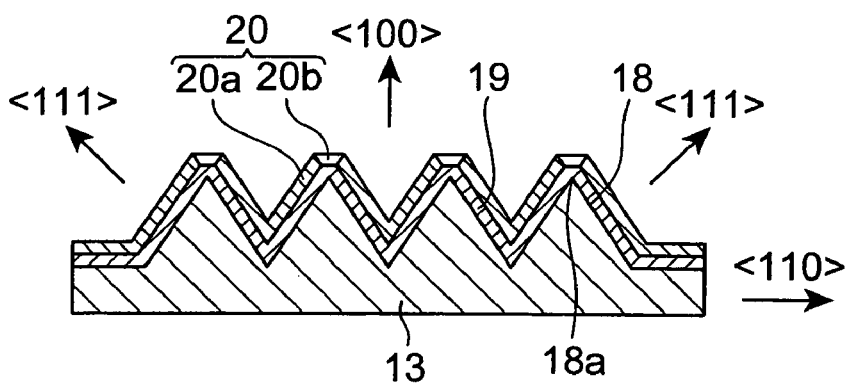
Figure 11D:
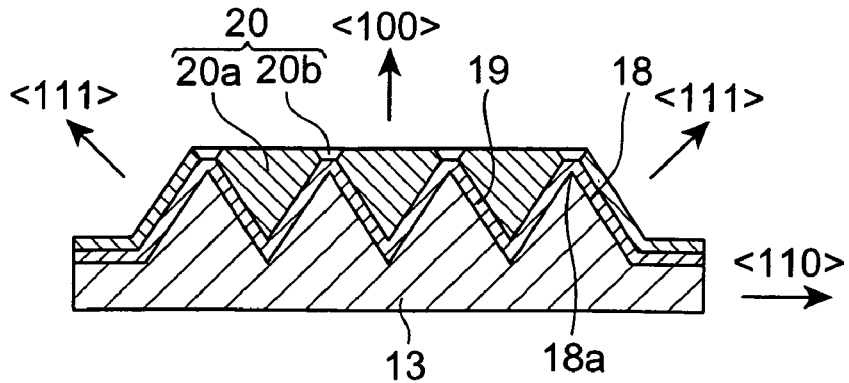

FIGS. 11A-11D show a constructional example of a pin junction type semiconductor diamond according to the present invention. The pin junction type semiconductor diamonds as shown in FIGS. 11A and 11B are both the ones, in which the non-doped diamond epitaxial layer 19 (i layer) is formed on the n-type diamond epitaxial layer 20 of the n-type semiconductor diamond as shown in FIG. 6C, and further thereon there is formed the p-type diamond epitaxial layer 17. In FIG. 11A, the surfaces of the non-doped diamond epitaxial layer 19 and the p-type diamond epitaxial layer 17 are both of a configuration having a plurality of {111} planes similar to the surface of the n-type diamond epitaxial layer 20. In FIG. 11B, the surface of the non-doped diamond epitaxial layer 19 is of a configuration having a plurality of {111} planes similar to the surface of the n-type diamond epitaxial layer 20, and the surface of the p-type diamond epitaxial layer 17 is of a flat configuration constituted by a plane parallel to the {100} plane of the substrate 10. Further, the pin conjunction type semiconductor diamond as shown in FIGS. 11C and 11D are both the ones, in which the non-doped diamond epitaxial layer 19 is formed on the triangular protrusion 18 formed on the single p-type semiconductor {100} diamond substrate 13, and further thereon there is formed the n-type diamond epitaxial layer 20. In FIG. 11C, the surfaces of the non-doped diamond epitaxial layer 19 and the n-type diamond epitaxial layer 20 are both of a configuration having a plurality of {111} planes. In FIG. 11D, the surface of the non-doped diamond epitaxial layer 19 is of a configuration having a plurality of {111} planes, and the surface of the n-type diamond epitaxial layer 20 is of a flat configuration constituted by a plane parallel to the {100} plane of the substrate 13. Further, in FIGS. 11C and 11D, on the surface of the n-type diamond epitaxial layer there are exposed both the <111> growth sector 20a and the <100> growth sector 20b. It is noted that in FIGS. 11A-11D the triangular protrusion 18 may be replaced by the quadrangular pyramidal protrusion 24.

Figure 12A:
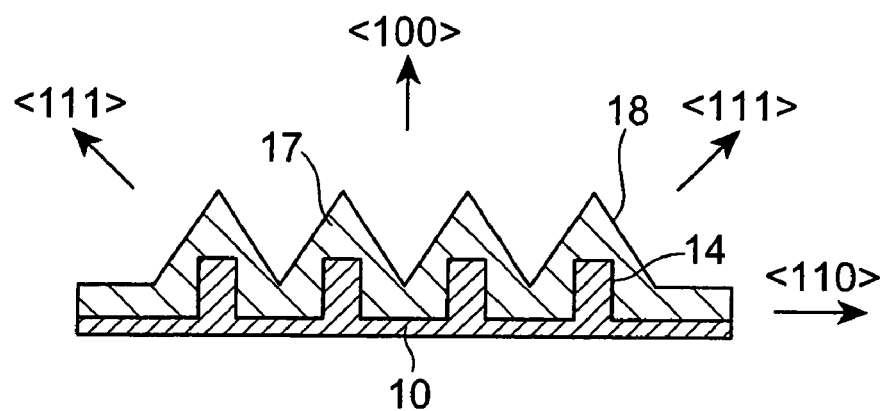
FIGS. 12A, 12B, and 12C are depictions of a constructional example of a p-type single crystal semiconductor {100} diamond substrate for use with the present invention.
Figure 12B:
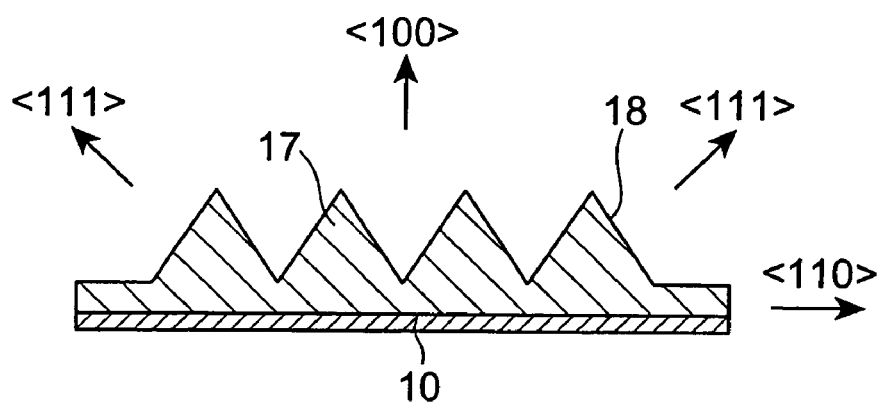
Figure 12C:
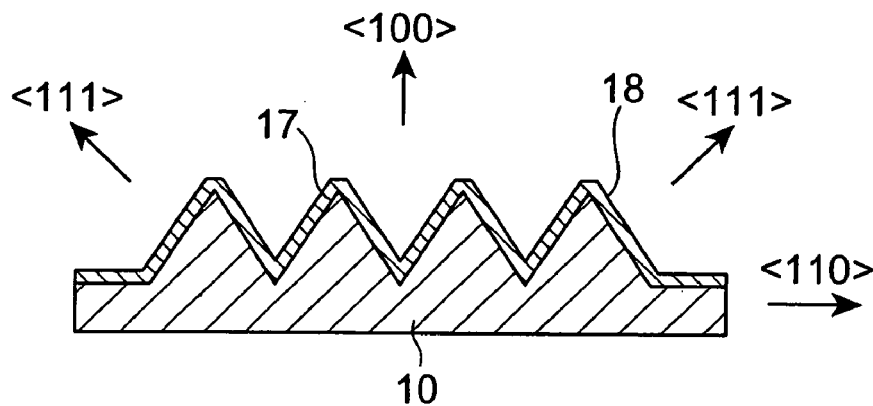

FIGS. 12A-12C show a constructional example of a single crystal p-type semiconductor {100} diamond substrate used according to the present invention. As the p-type single crystal semiconductor {100} diamond substrate there can be used a high-temperature high-pressure synthesis IIb substrate or a high-temperature high-pressure synthesis boron-containing Ib substrate. Alternatively, there may be the one, in which a boron-doped diamond thin film formed on a high-temperature high-pressure Ib substrate or a high-temperature high-pressure IIa substrate. The single crystal p-type semiconductor {100} diamond substrate as shown in FIG. 12A is the one, in which there is achieved epitaxial growth of the boron-doped diamond layer 17 in place of the non-doped diamond layer 16. Here, the combination of the rectangular protrusion 14 and the triangular protrusion 18 may be replaced by the combination of the cylindrical protrusion 22 and the quadrangular pyramidal protrusion 24. The single crystal p-type semiconductor {100} diamond substrate is the one, in which there is directly formed by means of vapor-phase synthesis the triangular protrusion 18 comprised of the boron-doped diamond layer 17. Here, the triangular protrusion 18 may be replaced by the quadrangular pyramidal protrusion 24. Further, the single crystal p-type semiconductor {100} diamond substrate as shown in FIG. 12C is the one, in which there is achieved epitaxial growth over an extremely short time of the boron-doped diamond layer 17 on the single-crystalline {100} diamond substrate 10 with the triangular protrusion 18 formed on its surface. Here, the triangular protrusion 18 may be replaced by the quadrangular pyramidal protrusion 24.

It is noted that regarding the above-mentioned n-type semiconductor diamond, pn junction type semiconductor diamond, pnp junction type semiconductor diamond, npn junction type semiconductor diamond, and pin junction type semiconductor diamond, to ascertain the interface between the n-type diamond epitaxial layer formed on the substrate and the substrate, one may, for example, examine an in-plane distribution of a emission spectrum by means of a cathode luminescence (CL) or a photo-luminescence (PL) with reference to an adequate cleavage plane.

EXAMPLES

There will now be further described a method of fabricating n-type semiconductor diamond; an n-type semiconductor diamond; a pn junction type semiconductor diamond; a pnp junction type semiconductor diamond; an npn junction type semiconductor diamond; and a pin junction type semiconductor diamond by way of examples.

Example 1

There was prepared a single crystal {100} diamond substrate which was cut such that the orientations of the top surface and side faces are {100} as shown in FIG. 1A. As shown in FIG. 1B, there was formed by a photo-lithography method, in the <110> direction on a part of the surface of the single-crystalline {100} diamond substrate, an Al thin film mask 12 (film thickness of 0.5 μm) having a line and space pattern with the line width of 5 μm and the pitch of 5 μm.

Next, The single-crystalline {100} diamond substrate patterned with the Al thin film mask 12 was transferred to dry etching device, and subjected to reactive ion etching under the conditions as follows: 99% $O_2$ and 1% $CF_4$ as etching gas; 200 W RF power; pressure of 6.6 Pa; 40 minutes of etching time; and 7 μm of etching depth. After that, Al thin film mask 12 was removed by means of Semico Clean. This causes, as shown in FIG. 2A, the diamond rectangular protrusion 14, rectangular in shape of a cross section and extending in one direction, to be formed on the surface layer of the single-crystalline {100} diamond substrate 10.

Using microwave plasma CVD device, there was formed the non-doped diamond layer 16 on the rectangular protrusion 14 under the conditions as follows: hydrogen gas flow rate of 0.1 l/min (100 sccm); methane gas flow rate of $5 \times 10^{-3}$ l/min (5 sccm); pressure of $1.3 \times 10^4$ Pa; microwave power of 300 W; substrate temperature of 850° C.; and growth time of 3 hours. This causes the triangular protrusion 18 pertaining to a {111} plane to be formed on the rectangular protrusion 14.

Next, using microwave plasma CVD device, there was formed a phosphorus-doped epitaxial layer 20 on the triangular protrusion 18 as shown in FIG. 2C under the conditions of: hydrogen gas flow rate of 0.195 l/min (195 sccm); Methane gas flow rate of $1 \times 10^{-3}$ l/min (1 sccm); hydrogen-diluted phosphine ($PH_3$; 1000 ppm) flow rate of $5 \times 10^{-3}$ l/min (5 sccm); pressure of $1.3 \times 10^4$ Pa; microwave power of 350 W; substrate temperature of 900° C.; and growth time of 12 hours.

Further, the growth over 18 hours of the n-type diamond epitaxial layer under the condition led to obtaining the n-type diamond epitaxial layer having a cross-sectional configuration as shown in FIG. 2D.

Figure 5A:
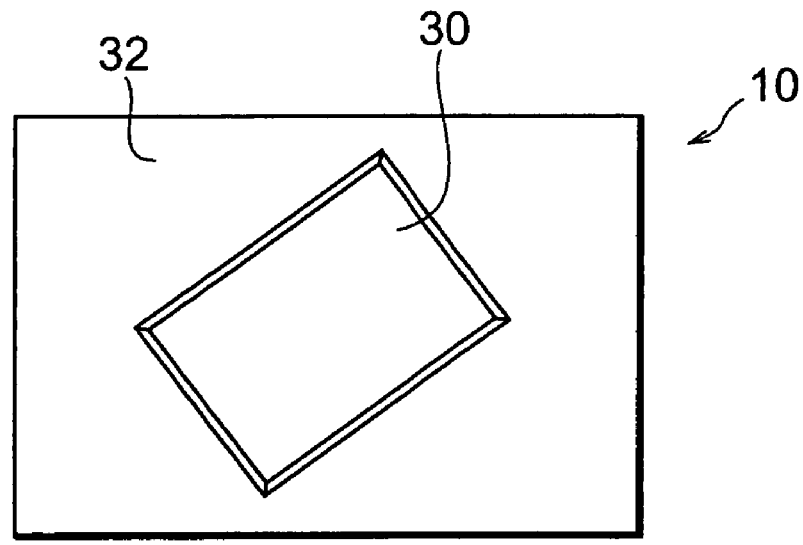
FIGS. 5A and 5B are plan views of the single-crystalline {100} diamond substrate where there is formed a phosphorus-doped diamond layer on the single-crystalline {100} diamond substrate having a plurality of {111} planes provided on the surface thereof.

In the plane view of the single-crystalline {100} diamond substrate 10 of FIG. 5A, regarding a first region 30 where the phosphorus-doped diamond epitaxial layer 20 was formed on the triangular protrusion 18, and a second region 32 where there was formed the phosphorus-doped diamond layer 20 without forming the triangular protrusion 18, the doping density of phosphorus was examined by use of SIMS (Secondary Ion Mass Spectrometry).

As a result, the phosphorus concentrations of the first 30 and second 32 regions both did not exceed $1.8 \times 10^{17}$ $cm^{-3}$ (1 ppm). At this stage, it was considered that on the surface of the first region 30 there was exposed the <100> growth sector 20b. It was confirmed that the diamond grown along the <100> direction was hardly susceptible of doping.

Next, as shown in FIG. 2E, hence by means of reactive ion etching, by the use of a dry etching device, under the same condition as that for the formation of the rectangular protrusion 14 at the first region 30, the surface layer of the phosphorus-doped diamond 20 was removed up to the top portion 18a of the triangular protrusion 18. This enabled the ablation of the layer containing the low phosphorus-doping efficiency diamond grown along the <100> direction. Etching time was 20 min.

As a result of the analysis by use of SIMS of the phosphorus-doped diamond layer 20 within the first region 30, the phosphorus concentration was found to be $4.2 \times 10^{19}$ $cm^{-3}$ (240 ppm). It could be hereby ascertained that by removing the layer containing the diamond grown along the <100> direction within the phosphorus-doped diamond 20, there emerged onto the surface the portion with high-doping efficiency grown along the <111> direction of the phosphorus-doped diamond layer 20.

At the same time, regarding the phosphorus-doped diamond layer 20 formed on the triangular protrusion 18 after the ablation of the layer containing the diamond grown along the <100> direction, there was examined the conductivity type of the carrier through the current/voltage measurements by means of STS (Scanning Tunneling Spectroscopy). As a result, from I-V curve it was found that the phosphorus-doped diamond layer 20 exhibited the n-type characteristics.

In the case of the array pitch of 1 μm-150 μm and the height of 1 μm-100 μm of the triangular protrusion 18, a similar structure was ascertained to be formed. Further, the synthesis condition for the formation of the phosphorus-doped diamond layer 20 was set as follows: methane concentration (methane gas flow rate/hydrogen gas flow rate) of 0.001%-1%; phosphine concentration (phosphine gas flow rate/methane gas flow rate) of 100 ppm-20000 ppm; pressure of $2.6 \times 10^3$ Pa-$2.6 \times 10^4$ Pa; and temperature of 800° C.-1200° C. In this case, a structure similar to that of FIGS. 2C-2D was ascertained to be formed, and the phosphorus-doped diamond 20 exhibited the n-type characteristics. Further, simultaneously with the formation of the phosphorus-doped diamond layer 20 within the range of the synthesis condition, there was caused to grow a phosphorus-doped diamond on the surface of the single crystal {111} diamond substrate, and each of the growth rates of the phosphorus-doped diamond was measured. As a result, it was discovered that the growth rate of the phosphorus-doped diamond layer 20 is 2-4 times faster than that on the single crystal {111} diamond substrate. It was therefrom found that there was the reentrant angle effect of the phosphorus-doped diamond growth on the structure of FIG. 2B, and the effectiveness with this structure was established. Further, under the growth condition for the phosphorus-doped diamond layer 20 of: hydrogen flow rate of 0.195 l/min (195 sccm); methane gas flow rate of $1 \times 10^{-3}$ l/min (1 sccm); hydrogen-diluted phosphine ($PH_3$: 1000 ppm) flow rate of $5 \times 10^{-3}$ l/min (5 sccm); pressure of $1.3 \times 10^4$ Pa; microwave power of 350 W; and substrate temperature of 900° C., the growth was interrupted at the intermediary configuration between FIG. 2C and FIG. 2D, and at the point of time when both {100} planes and {111} planes co-existed on the surface, the surface was, by means of polishing, flattened to become parallel to a {100} plane. Further, as a result of SIMS analysis of the flattened surface, $2.1 \times 10^{19}$ $cm^{-3}$ (120 ppm) of the phosphorus concentration was detected. It was considered that on the surface there appeared the <100> growth sector with low-doping efficiency and the <111> growth sector with high-doping efficiency half and half. Electrodes were formed on the surface, and electric characteristics were measured, whereby there were achieved good n-type characteristics to be measured. It was hereby ascertained that application to devices was possible also by use of such a formation. In the case of the triangular protrusion, whose number of {111} planes is small as compared with the quadrangular pyramidal protrusion, the number of sectors of the phosphorus-doped layer 20 is correspondingly small. It was hereby ascertained that as a whole a good-crystallinity phosphorus-doped diamond 20 was caused to grow.

Example 2

As is the case with the first example, there was prepared a single-crystalline {100} diamond substrate 10 which was cut such that the orientations of the upper face and side faces were {100}. Next, as shown in FIG. 3B, by means of photolithography, on the surface of the single-crystalline {100} diamond substrate 10 there were formed in a matrix form a plurality of circular Al thin film masks 12 with a 5 μm diameter and a 10 μm center distance.

Next, the single-crystalline {100} diamond substrate 10 patterned with the Al thin film mask 12 was transferred to dry etching device, and was subjected to restrictive ion etching under the condition similar to that of the first example. After that, Al thin mask 12 was removed using Semico Clean. This caused, as shown in FIG. 3C, a plurality of cylindrical protrusions 22 made of cylindrical diamond, arrayed side-by-side in a matrix form, to be formed on the single-crystalline {100} diamond substrate 10.

Then, using microwave plasma CVD device, there was formed the non-doped diamond layer 16 on the cylindrical protrusions 22 under the condition similar to that in the first example. This caused, as shown in a plane view of the single-crystalline {100} diamond substrate 10 of FIG. 3D, the quadrangular pyramidal protrusion 24 with its respective side consisting of a {111} plane to be formed on the cylindrical protrusion 22.

There being applied microwave plasma CVD device onto the quadrangular pyramidal protrusion 24, under the condition similar to that in the first example (hydrogen gas flow rate of 0.195 l/min (195 sccm); methane gas flow rate of $1 \times 10^{-3}$ l/min (1 sccm); hydrogen-diluted phosphine ($PH_3$; 1000 ppm) flow rate of $5 \times 10^{-3}$ l/min (5 sccm); pressure of $1.3 \times 10^4$ Pa; microwave power of 350 W; substrate temperature of 900° C.), there was formed a phosphorus-doped diamond layer on the single-crystalline {100} diamond substrate 10. Thirty hour growth caused, as shown in FIG. 4D, the phosphorus-doped diamond layer 20 to be obtained on the quadrangular pyramidal protrusion 24.

Figure 5B:
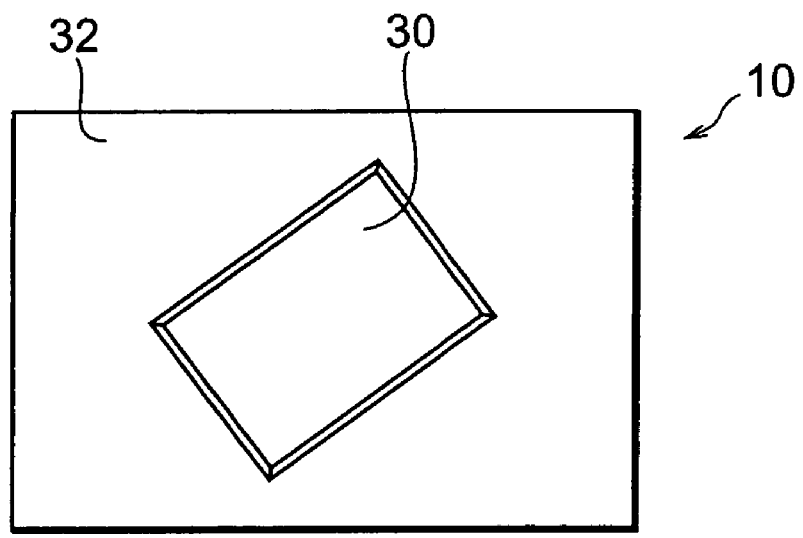

Here, in a plane view of the single-crystalline {100} diamond substrate 10 as shown in FIG. 5B, with respect to the first region 30 where the phosphorus-doped diamond layer 20 was formed on the quadrangular pyramidal protrusion 24, and the second region 32 where the phosphorus-doped diamond layer 20 was formed without forming the quadrangular protrusion 24, the respective phosphorus doping density was determined using SIMS.

As a result, the phosphorus concentrations of the first 30 and second 32 regions both did not exceed $1.8 \times 10^{17}$ cm$^{-3}$ (1 ppm). It was hereby ascertained that similar to the first example, there were hardly doped with phosphorus the phosphorus-doped diamond formed on the second region 32 consisting of the {100} plane of the substrate 10, and the <100> growth sector 20b exposed on the surface of the first region 30.

Next, as shown in FIG. 4E, using dry etching device, in the first region 30, there was removed the surface layer of the phosphorus-doped diamond layer 20 up to the top portion 24a of the quadrangular pyramidal protrusion 24 by means of reactive ion etching under the condition similar to that for the formation of the cylindrical protrusion 22. This allowed for the ablation of the layer containing the low-phosphorus doping efficiency diamond grown along the <100> direction.

As a result of analysis by means of SIMS of the phosphorus-doped diamond layer 20 of the first region 30 after the ablation of the layer containing the diamond grown along the <100> direction, the phosphorus concentration exhibited $4.2 \times 10^{19}$ cm$^{-3}$ (240 ppm). It was hereby ascertained that by removing the layer containing the diamond grown in the direction at the phosphorus-doped diamond 20, there emerged onto the surface the high-doping portion of the phosphorus-doped diamond layer 20.

At the same time, regarding the phosphorus-doped diamond layer 20 of the first region 30 after the ablation of the layer containing the diamond grown along the <100> direction, from the current/voltage measurements by means of STS there was determined the conductivity type of the carrier. As a result, from I-V curve it was revealed that the phosphorus-doped diamond layer 20 offers n-type characteristics.

It was ascertained that with the quadrangular pyramidal protrusion 24 having the array pitch of 1 μm-150 μm and the height of 1 μm-100 μm, a similar structure was formed. Further, the synthesis condition for the formation of the phosphorus-doped diamond layer 20 was set as follows: methane concentration (methane gas flow rate/hydrogen gas flow rate) of 0.001%-1%; phosphine concentration (phosphine gas flow rate/methane gas flow rate) of 100 ppm-20000 ppm; pressure of $2.6 \times 10^3$ Pa-$2.6 \times 10^4$ Pa; temperature of 800° C.-1200° C. In this case a structure similar to FIGS. 4C-4D was formed. It was hereby ascertained that the phosphorus-doped diamond layer 20 showed n-type characteristics. Here, in the case where the formation of a diamond n-type electron emitting element is desired, in view of the structure of FIG. 4B, the phosphorus-doped diamond grown from the top portion 24a of the quadrangular pyramidal protrusion 24 should rather not be flat as is the case with FIGS. 4C-4D. In view of this, regarding the range pertaining to the synthesis condition for the phosphorus-doped diamond layer 20, the phosphine concentration was set as equal to or more than 30000 ppm, whereby the growth rate $V_B$<100> along the <100> direction was increased, and on the top portion 24a of the quadrangular pyramidal protrusion 24 there remained an apex. That is, without being flattened (i.e., with the primary shape being preserved) there was shaped the phosphorus-doped diamond layer 20. The measurement of the electron emitting characteristics revealed good electron emitting characteristics in the case of a structure where the top portion 24a of the quadrangular pyramidal protrusion 24 was preserved on the surface of the phosphorus-doped diamond layer 20 as well.

Example 3

Figure 13A:
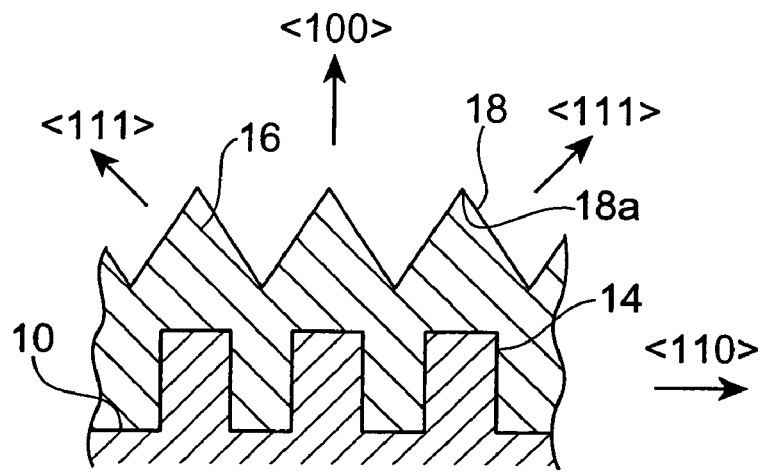
FIGS. 13A, 13B, and 13C are illustrations of an example of an n-type semiconductor diamond according to the invention.

As is the case with the first example, photolithography and reactive ion etching were applied to the single-crystalline {100} diamond substrate 10. This allowed the rectangular protrusion 14 extending in one direction of <110> to be formed on the surface layer of the single-crystalline {100} diamond substrate 10. In FIG. 13A there is shown this rectangular protrusion 14 in a cross section taken along the plane perpendicular to the extension direction thereof. The cross section of this rectangular protrusion 14 is of the size of 5 μm width and 7 μm height. Further, the distance between adjacent rectangular protrusions 14 is 5 μm.

Next, using microwave plasma CVD device, the non-doped diamond layer 16 was formed on the rectangular protrusion 14. On this occasion the synthesis condition for the non-doped diamond is set as follows: hydrogen gas flow rate of 0.1 l/min (100 sccm); methane gas flow rate of $5 \times 10^{-3}$ l/min (5 sccm); pressure of $1.3 \times 10^4$ Pa; microwave power of 300 W; substrate temperature of 850° C.; and growth time of 3 hours. This allowed for the formation of the triangular protrusion 18 with its surface constituted by a plurality of {111} planes. The angle between these {111} planes and the substrate surface of the substrate 10 was measured to fall within the range of 55°±2°.

Figure 13B:
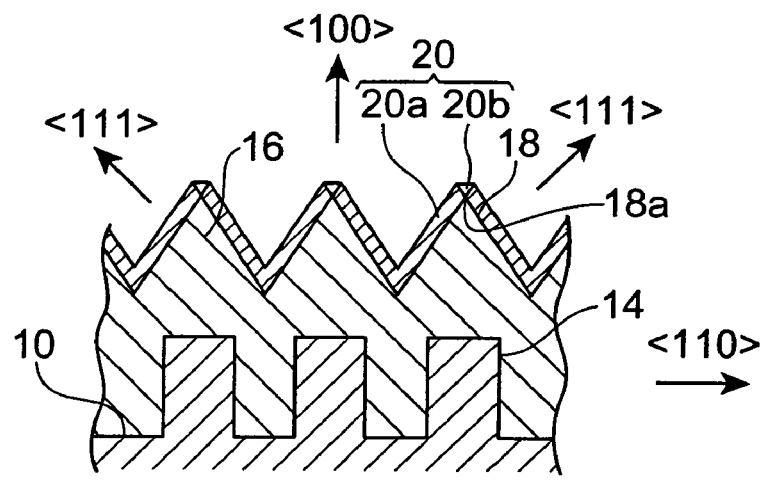

Subsequently, using microwave plasma CVD device, as shown in FIG. 13B, the phosphorus-doped diamond layer 20 was formed on the triangular protrusion 18. On this occasion the synthesis condition for the phosphorus-doped diamond was set as follows: hydrogen gas flow rate of 0.499 l/min (499 sccm); methane gas flow rate of $5 \times 10^{-4}$ l/min (0.5 sccm); hydrogen-diluted phosphine ($PH_3$: 1000 ppm) flow rate of $1 \times 10^{-3}$ l/min (1 sccm); pressure of $1.3 \times 10^4$ Pa; microwave power of 320 W; substrate temperature of 870° C.; and growth time of 2 hours. The phosphorus-doped diamond layer 20 is constituted by the <111> growth sector 20a and the <100> growth sector 20b. The <111> growth sector 20a refer to the portion grown along the <111> direction from the surface of the triangular protrusion 18. Further, the <100> growth sector 20b refer to the portion grown along the <100> direction from the top portion 18a of the triangular protrusion 18. The <100> growth sector 20b is difficult to be doped with phosphorus, and hence exhibits high resistance, as compared with the <111> growth sector 20a which is easily doped with phosphorus.

It is noted that the phosphorus-doped diamond layer formed on the high-temperature, high-pressure synthesis single crystal IIa {111} diamond substrate under the same condition as the above one, is found, from the result of SIMS and Hall effect measurements, to have the following properties. That is, the phosphorus-doped diamond layer in this case has: film thickness of 1 μm; phosphorus concentration of $1.2 \times 10^{19}$ $cm^{-3}$ (68 ppm); conductivity type of n-type; activation energy of 0.58 eV; and resistivity of $8.8 \times 10^4$ Ωcm at room temperature (300 K).

Figure 13C:
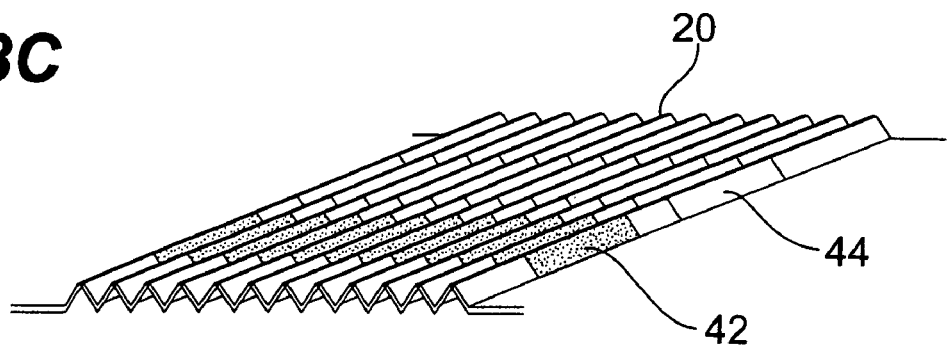

To ascertain that the created phosphorus-doped diamond layer 20 exhibits n-type semiconductor characteristics, electric properties of the whole <111> growth sector was measured. For this measurement, after oxygen terminating the surface of the phosphorus-doped diamond layer 20, as shown in FIG. 13C, Al ohmic electrodes 42 and Au Schottky electrodes 44 were formed. Subsequently, Al ohmic electrodes 42 were connected to the minus side of a DC source whereas Au Schottky electrodes 44 were connected to the plus side, and voltage/current characteristics were measured. As a result, I-V curve exhibited a drastic rise of forward current at the voltage equal to or more than 2.0 V. On the other hand, backward current occurred hardly even with applied minus voltage of equal to or more than 50 V. That is, the phosphorus-doped diamond layer 20 was observed to exhibit rectification property. It was hereby ascertained that an n-type semiconductor diamond n-type Schottky diode was created. Further, Schotkky LED properties were measured using this n-type semiconductor, whereby good light emission characteristics were observed.

Example 4

Figure 14A:
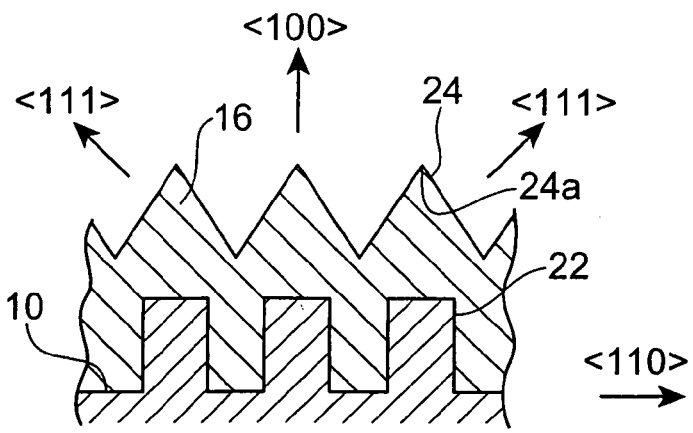
FIGS. 14A, 14B, 14C, and 14D are illustrations of an example of n-type semiconductor diamond according to the invention.

As is the case with the second example, photolithography and reactive ion etching were applied to the single-crystalline {100} diamond substrate 10 which was cut such that the orientations of the upper face and side faces thereof ware {100}. This caused the formation of a plurality of cylindrical protrusions 22 in a matrix form on the surface of the single-crystalline {100} diamond substrate. In FIG. 14A, there were shown the cylindrical protrusions 22 in a cross section taken along the plane containing the centerlines thereof. This protrusion 22 is 5 μm in diameter and 7 μm in height. Further, the center distance between adjacent protrusions 22 is 10 μm.

Next, using microwave plasma CVD device, under the same non-doped diamond synthesis condition as the third example, the non-doped diamond layer 16 was formed on the cylindrical protrusions 22. This caused the formation of the quadrangular pyramidal protrusions 24 with their surface constituted by a plurality of {111} planes on the cylindrical protrusions 22. The angle between these {111} planes and the substrate surface was measured to fall within the range of 55°±3°.

Figure 14B:
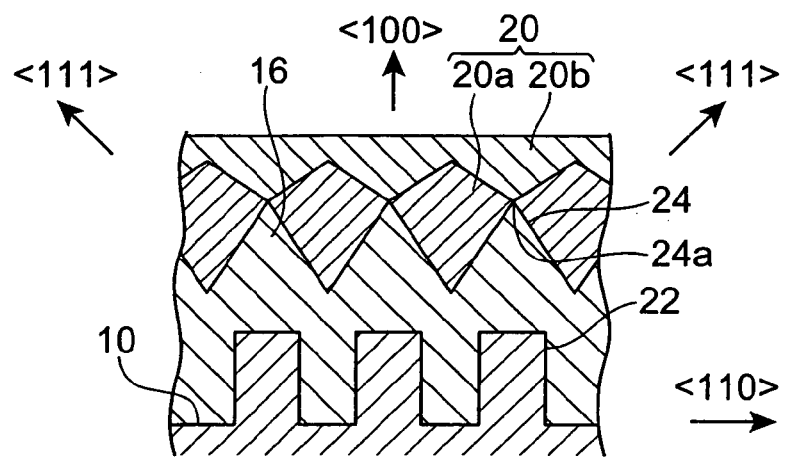
Figure 14C:
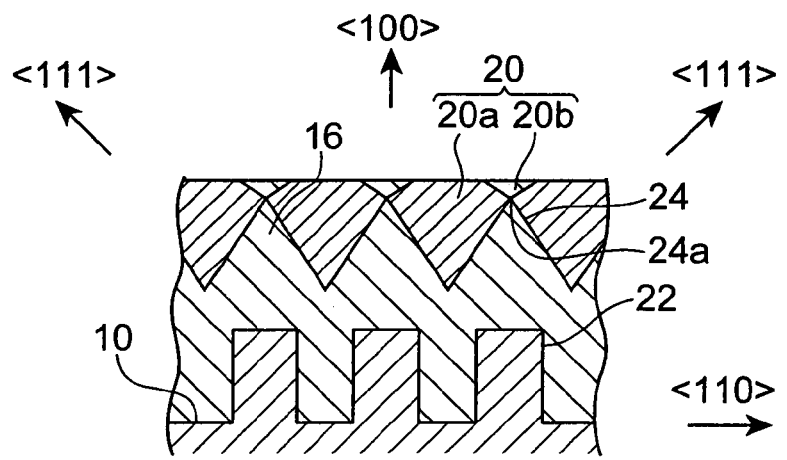

Subsequently, using microwave plasma CVD device, as shown in FIG. 14B, the phosphorus-doped diamond 20 was formed on the quadrangular pyramidal protrusions 24. The phosphorus-doped diamond synthesis condition was the same as in the third example except the growth time of 30 hours. At this stage, the phosphorus-undoped <100> growth sector 20b was exposed over the entire surface of the phosphorus-doped diamond layer 20. In view of this, the <100> growth sector 20b was etched by means of reactive ion etching until the phosphorus-doped <111> growth sector 20a was exposed. The etching condition is set as follows: etching gas of $O_2$; RF power of 400 W; pressure of 6.6 Pa; and etching time of 20 min. This caused, as shown in FIG. 14C, both the <100> growth sector 20b and <111> growth sector 20a to be exposed on the surface of the phosphorus-doped diamond layer 20.

It is noted that in the case where the phosphorus-doped diamond layer 20 is formed on the quadrangular pyramidal protrusions 24 as in this example, the <111> growth sector 20a refer to the portion grown along the <111> direction from the surface of the quadrangular pyramidal protrusion 24. Further, the <100> growth sector 20b refer to the portion grown along the <100> direction from the top portion 24b of the quadrangular pyramidal protrusion 24.

Figure 14D:
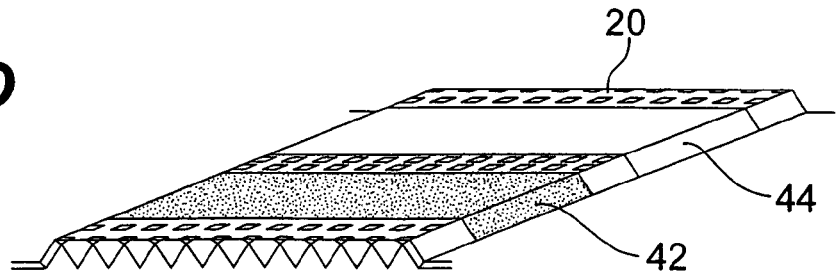

As shown in FIG. 14D, Al ohmic electrodes 42 and Au Schottky electrodes 44 were formed with respect to the created phosphorus-doped diamond layer 20. Then, As is the case with the third example, voltage/current characteristics were observed, whereby the phosphorus-doped diamond layer 20 was observed to exhibit rectification property. It was hereby ascertained that an n-type semiconductor diamond n-type Schottky diode was created.

Example 5

Figure 15A:
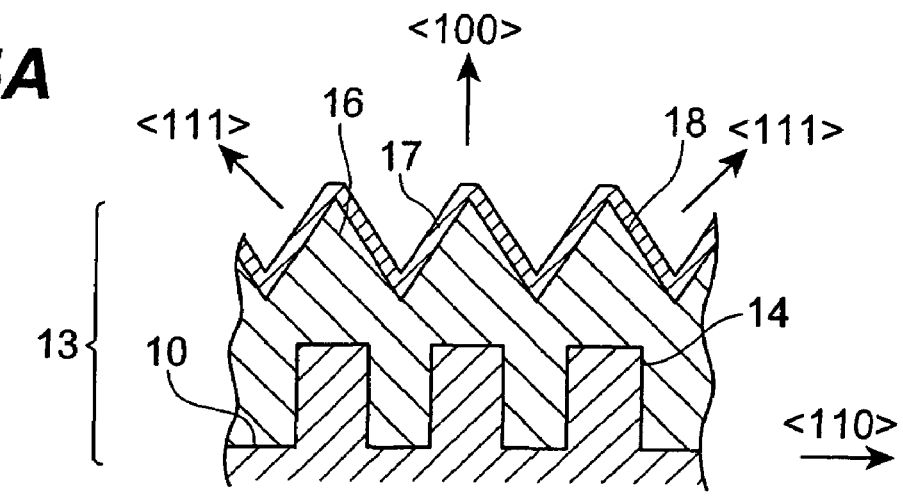
FIGS. 15A, 15B, and 15C are illustrations of an example of pn junction type semiconductor diamond according to the invention.

As shown in FIG. 15A, the rectangular protrusions 14 were formed on the single-crystalline {100} diamond substrate 10, and the triangular protrusions 18 were formed on the rectangular protrusions 14. The method of forming the rectangular 14 and triangular 18 protrusions is the same as in the third example. Further, using microwave plasma CVD device, the boron-doped diamond layer (p-type diamond epitaxial layer) 17 was formed on the triangular protrusions 18. On this occasion the boron-doped diamond synthesis condition is set as follows: hydrogen gas flow rate of 0.495 l/min (495 sccm); methane gas flow rate of $5\times10^{-4}$ l/min (0.5 sccm); hydrogen-diluted diborane ($B_2H_6$: 10 ppm) flow rate of $5\times10^{-3}$ l/min (5 sccm); pressure of $1.3\times10^4$ Pa; microwave power of 320 W; substrate temperature of 870° C.; and growth rate of 2 hours. There was hereby created the single crystal p-type semiconductor {100} diamond substrate 13 with a plurality of {111} planes formed on its surface. The angle between these {111} planes and the substrate surface of the substrate 10 was measured to fall within the range of 55°±1°.

It is noted that the boron-doped diamond layer formed on the high-temperature, high-pressure synthesis single crystal IIa {111} diamond substrate under the same condition as the above one, is found from the result of SIMS and Hall effect measurements to have the following properties. That is, the boron-doped epitaxial layer in this case has: film thickness of 1 μm; boron concentration of $3.1\times10^{17}$ cm$^{-3}$ (2 ppm); conductivity type of p-type; activation energy of 0.36 eV; resistivity of 400 Ωcm at room temperature (300 K). As for the boron-doped epitaxial layer, the difference of electric properties according to the growth sectors is negligible opposed to the phosphorus-doped layer.

Figure 15B:
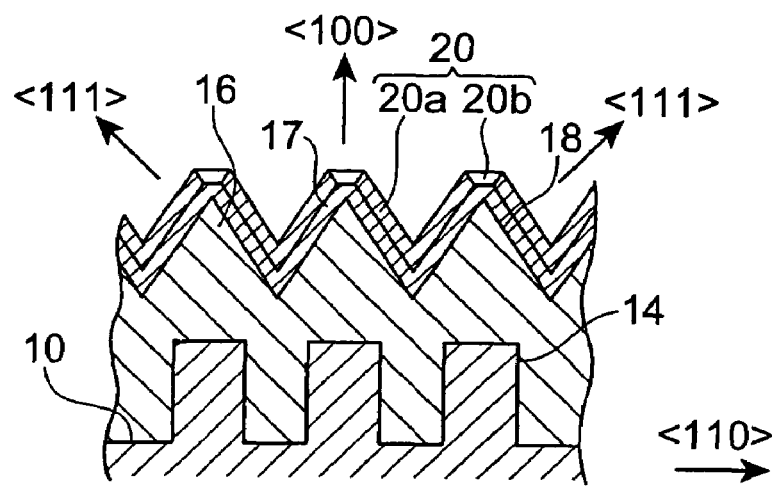

As shown in FIG. 15B, using microwave plasma CVD device, under the same phosphorus-doped diamond synthesis condition as in the third example, the phosphorus-doped diamond layer 20 was formed on the single crystal p-type semiconductor {100} diamond substrate.

To ascertain that created single crystal p-type semiconductor {100} diamond substrate 13 and phosphorus-doped diamond layer 20 exhibited the semiconductor properties of the pn junction type semiconductor, electric properties of these were measured. In view of this, to form electrodes on each of the single crystal p-type semiconductor {100} diamond substrate 13 and phosphorus-doped diamond layer 20, a portion of the phosphorus-doped diamond layer 20 was removed by means of etching. For etching, a combination of photolithography and reactive ion etching was used. This caused the single crystal p-type semiconductor {100} diamond substrate 13 to be exposed on the portion from which the phosphorus-doped diamond layer 20 was removed.

Figure 15C:
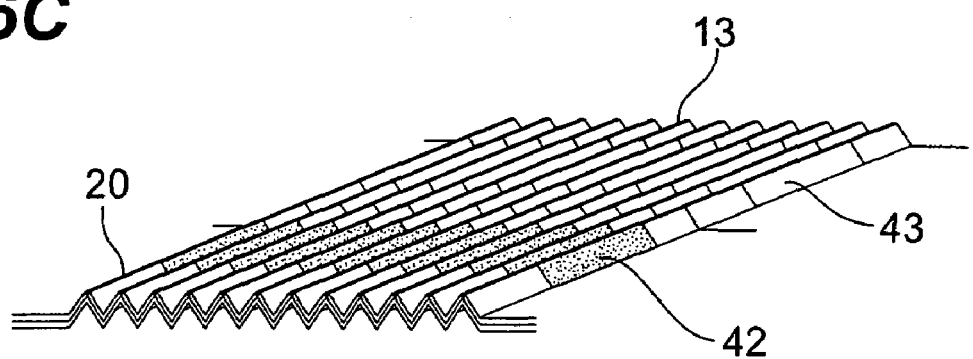

As shown in FIG. 15C, Ti/Pt/Au ohmic electrodes 43 were formed on the single crystal p-type semiconductor {100} diamond substrate 13. Further, Al ohmic electrodes 42 were formed on the phosphorus-doped diamond layer 20 after oxidizing the surface of the layer 20. Here, regarding the formation of the Al ohmic electrodes 20, it was taken into account, As is the case with the third example, that the <111> growth sector and the <100> growth sector differ in the phosphors concentration to be doped. Further, Ti/Pt/Au ohmic electrodes 43 are connected to the plus side of a DC source whereas the Al ohmic electrodes 42 are connected to the minus side of the DC source, and voltage/current characteristics were measured.

As a result, I-V curve showed a drastic rise of forward current at the voltage equal to or more than 5.0 V. On the other hand, backward current occurred hardly even with the applied minus voltage of above 50 V. That is, the single crystal p-type semiconductor {100} diamond substrate 13 and the phosphorus-doped diamond layer 20 were observed to exhibit rectification property. It was hereby ascertained that the semiconductor diamond having a pn junction structure (diamond pn junction diode) was created. Further, this semiconductor diamond was observed to emit light at the forward current of above 200 μA. As a result of the measurement of the emission spectrum by means of spectrometry, UV light emission with its peak at 235 nm, together with band A light emission around 500 nm, was observed. This UV light emission was considered to be free exciton emission of diamond. Therefore, the created semiconductor diamond was ascertained to be diamond UV LED (light emitting device). Further, this semiconductor diamond was ascertained to operate as diamond UV light detector.

Example 6

Figure 16A:
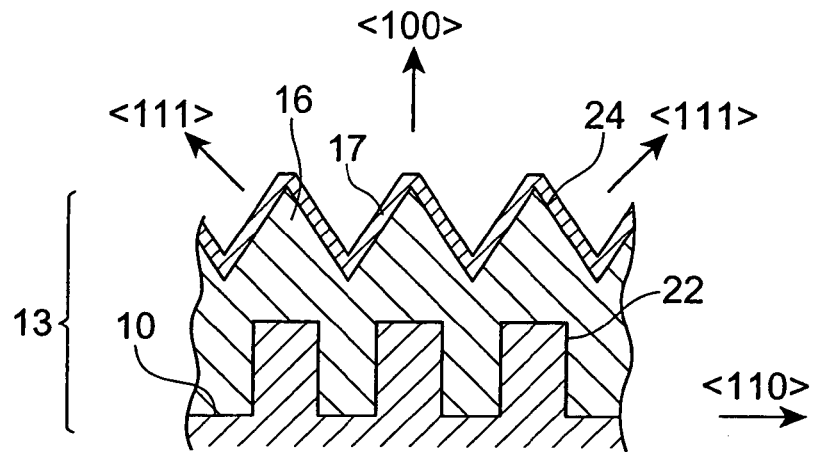
FIGS. 16A, 16B, and 16C are illustrations of an example of a pn junction type semiconductor diamond according to the invention.

As shown in FIG. 16A, the cylindrical protrusions 22 were formed on the single-crystalline {100} diamond substrate 10, and the quadrangular pyramidal protrusions 24 were formed on the cylindrical protrusions 22. The method of forming the cylindrical 22 and quadrangular pyramidal 24 protrusions is the same as in the forth example. Further, in this embodiment, using microwave plasma CVD device, the boron-doped diamond layer 17 was formed on the quadrangular pyramidal protrusions 24. This allowed for the creation of the single crystal p-type semiconductor {100} diamond substrate with a plurality of {111} planes formed on its surface. The angle between these {111} planes and the substrate surface of the substrate 10 was measured to fall within the range of 55°±30°. Further, the phosphorus-doped diamond layer 20 was formed on the single crystal p-type semiconductor {100} diamond substrate 13 under the same phosphorus-doped diamond synthesis condition as in the forth example.

Figure 16B:
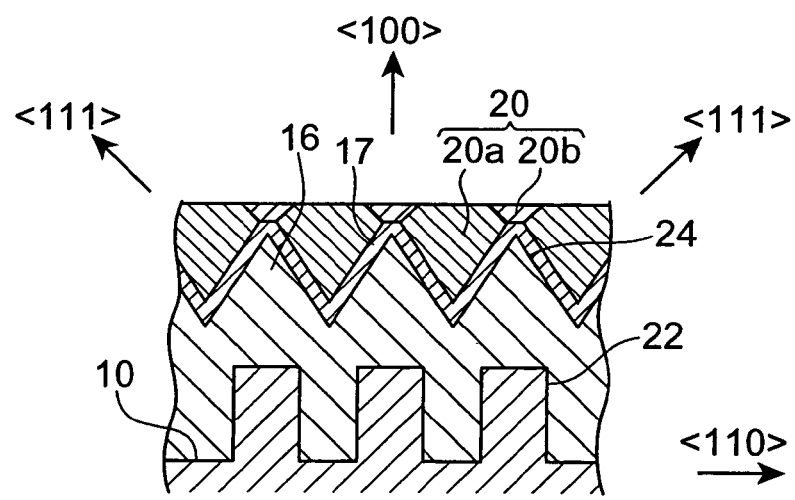

As shown in FIG. 16B, As is the case with the forth example, the <111> growth sector 20a and the <100> growth sector 20b both were exposed on the surface of the phosphorus-doped diamond layer 20 by means of reactive ion etching.

Figure 16C:
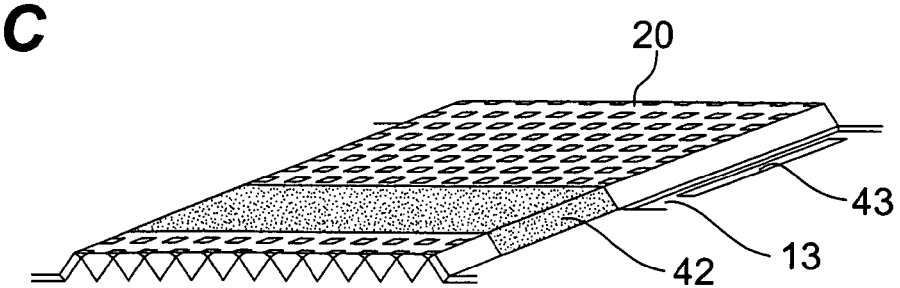

As shown in FIG. 16C, Al ohmic electrodes 42 were formed on the phosphorus-doped diamond layer 20. Further, a portion of the single crystal semiconductor {100} diamond substrate 13 was exposed by means of reactive ion etching, and Ti/Pt/Au ohmic electrodes 43 were formed on the portion. Further, As is the case with the fifth example, voltage/current characteristics of the single crystal p-type semiconductor {100} diamond substrate 13 and the phosphorus-doped diamond layer 20 were measured, whereby distinctive rectification property was observed. It was hereby ascertained that the semiconductor diamond having a pn junction structure (diamond pn junction diode) was created. Further, As is the case with the fifth example, this semiconductor diamond was ascertained to be diamond UV LED.

Example 7

Figure 17A:
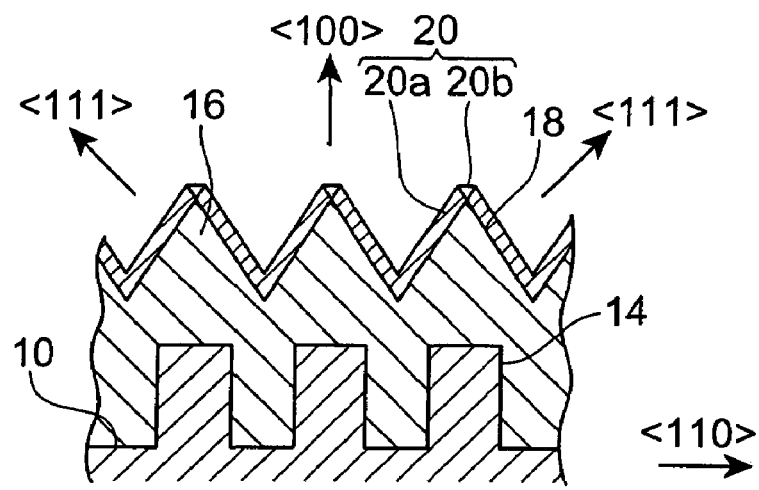
FIGS. 17A, 17B, and 17C are illustrations of an example of a pn junction type semiconductor diamond according to the invention.

As shown in FIG. 17A, the rectangular protrusions 14 were formed on the single-crystalline {100} diamond substrate 10 which was cut such that the orientations of the upper face and side faces were {100}, and the triangular protrusions 18 were formed on the rectangular protrusions 14. The method of forming the rectangular 14 and triangular 18 protrusions is the same as in the third example. The angle between these {111} planes and the substrate surface of the substrate 10 was measured to fall within the range of 55°±40°. Further, the phosphorus-doped diamond layer 20 was formed on the triangular protrusions 18 under the same phosphorus-doped diamond synthesis condition as in the third example.

Figure 17B:
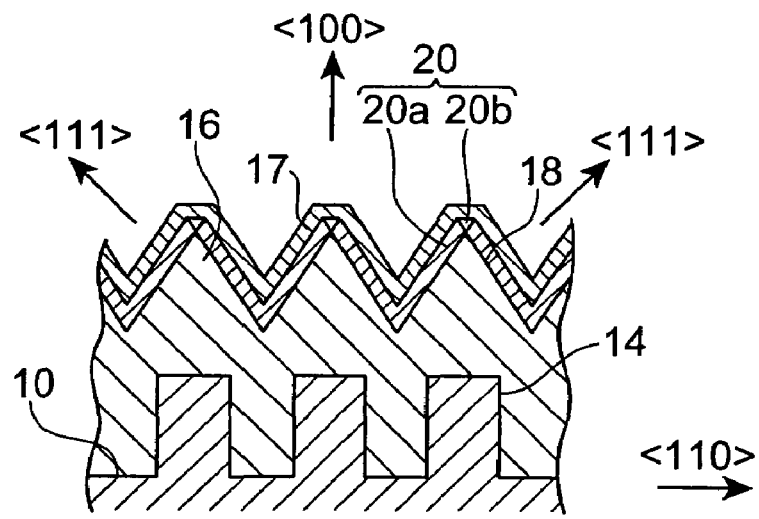

As shown in FIG. 17B, the boron-doped diamond layer 17 was formed on the phosphorus-doped diamond layer 20 under the same boron-doped diamond synthesis condition as in the fifth example. Further, a portion of the boron-doped diamond layer 17 was removed by means of reactive ion etching so that the phosphorus-doped diamond layer 20 was exposed on the portion removed.

Figure 17C:
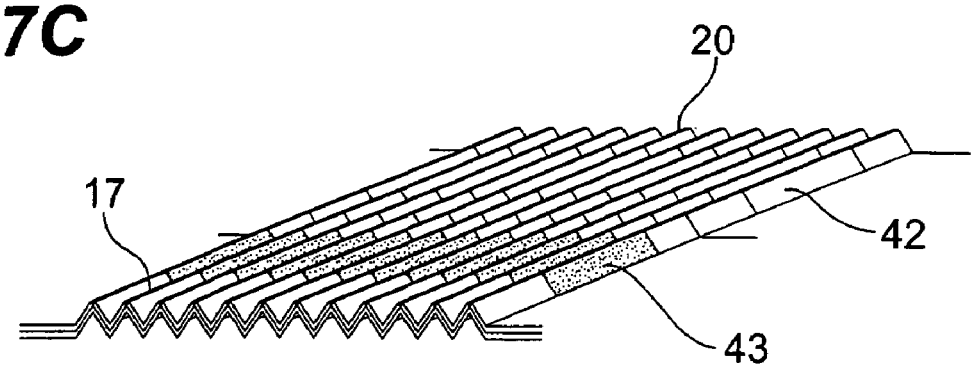

As shown in FIG. 17C, Al ohmic electrodes 42 were formed on the exposed phosphorus-doped diamond layer 20, and Ti/Pt/Au ohmic electrodes 43 were formed on the boron-doped diamond layer 17. As is the case with the fifth example, voltage/current characteristics of the phosphorus-doped diamond layer 20 and the boron-doped diamond layer 17 were measured, whereby distinctive rectification property was observed. It was hereby ascertained that the semiconductor diamond having a pn junction structure (diamond pn junction diode) was created. Further, As is the case with the fifth example, this semiconductor diamond was ascertained to be diamond UV LED.

Example 8

Figure 18A:
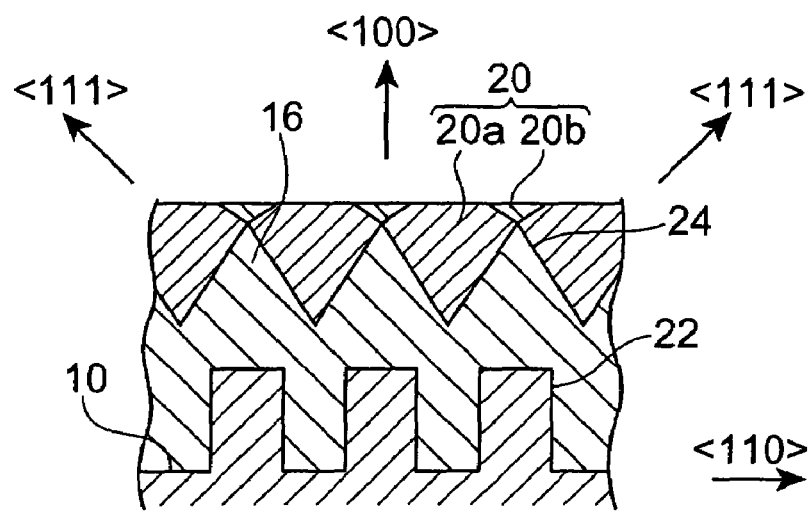
FIGS. 18A, 18B, and 18C are illustrations of an example of a pnp junction type semiconductor diamond according to the invention.

As shown in FIG. 18A, the cylindrical protrusions 22 were formed on the single-crystalline {100} diamond substrate which was cut such that the orientations of the upper face and side faces were {100}, and the quadrangular pyramidal protrusions 24 were formed on the cylindrical protrusions 22. The method of forming the cylindrical 22 and quadrangular pyramidal 24 protrusions was the same as in the forth example. The angle between these {111} planes and the substrate surface of the substrate 10 was measured to fall within the range of 55°±1°. Further, the phosphorus-doped diamond layer 20 was formed on the quadrangular pyramidal protrusions 24 under the same phosphorus-doped diamond synthesis condition as in the fourth example. Further, As is the case with the fourth example, the <111> growth sector 20a and the <100> growth sector 20b both were exposed on the surface of the phosphorus-doped diamond layer 20 by means of reactive ion etching.

Figure 18B:
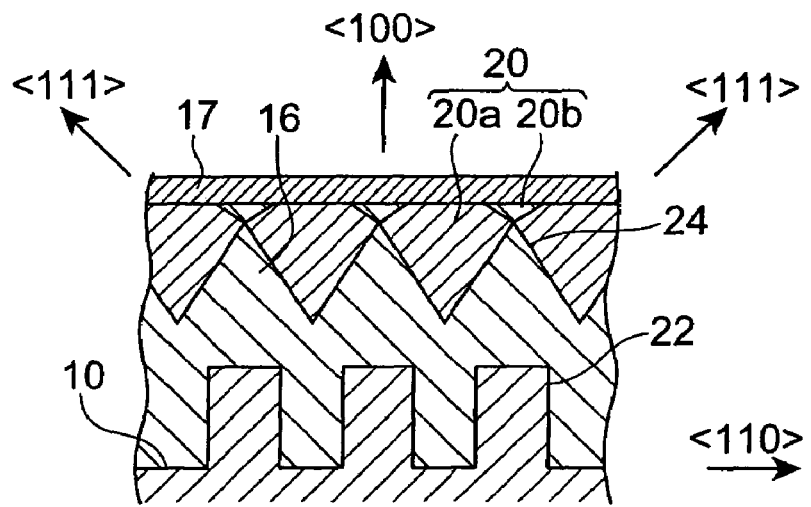

As shown in FIG. 18B, the boron-doped diamond layer 17 was formed on the phosphorus-doped diamond layer 20 under the same boron-doped diamond synthesis condition as in the example 5. Further, a portion of the boron-doped diamond layer 17 was removed by means of reactive ion etching, and the phosphorus-doped diamond layer 20 was exposed on the portion removed.

Figure 18C:
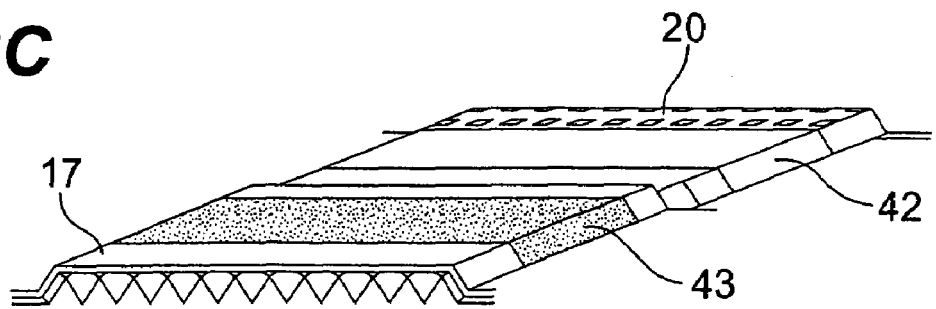

As shown in FIG. 18C, Al ohmic electrodes 42 were formed on the exposed phosphorus-doped diamond layer 20, and the Ti/Pt/Au ohmic electrodes 43 were formed on the boron-doped diamond layer 17. As is the case with the fifth example, voltage/current characteristics of the phosphorus-doped diamond layer 20 and the boron-doped diamond layer 17 were measured, whereby distinctive rectification property was observed. It was hereby ascertained that the semiconductor diamond having a pn junction structure (diamond pn junction diode) was created. Further, As is the case with the fifth example, this semiconductor diamond was ascertained to be diamond UV LED.

Example 9

Figure 19A:
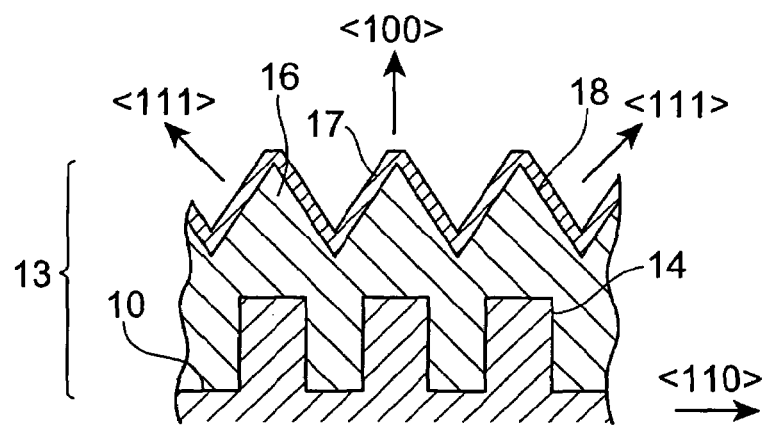
FIGS. 19A, 19B, 19C, and 19D are illustrations of an example of a pnp junction type semiconductor diamond according to the invention.
Figure 19B:
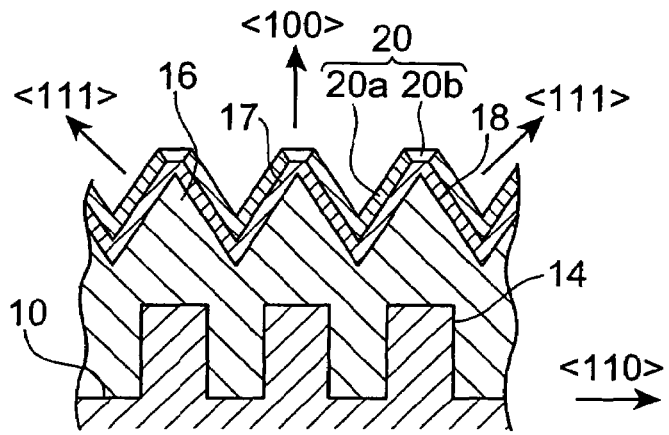
Figure 19C:
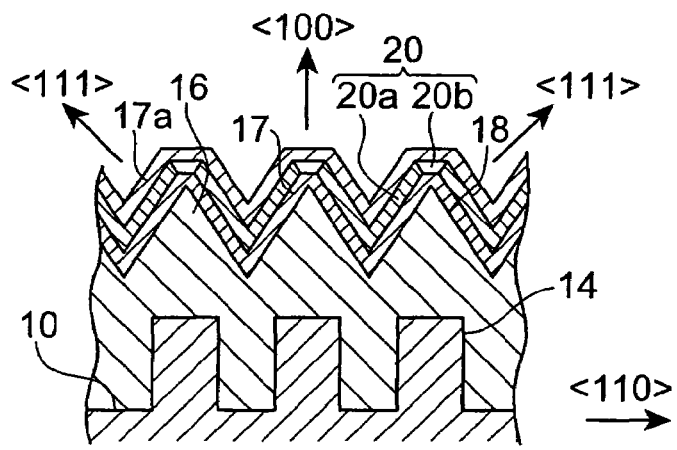

As shown in FIG. 19A, the p-type semiconductor {100} substrate 13 was created with the same method as in the fifth example. On this p-type semiconductor {100} diamond substrate 13 the phosphorus-doped diamond layer 20 was formed as shown in FIG. 19B, under the same phosphorus-doped diamond synthesis condition as in the third example except the growth time of one hour. Further, On the phosphorus-doped diamond layer 20 the boron-doped diamond layer 17a was formed as shown in FIG. 19C, under the same boron-doped diamond synthesis condition as in the fifth example except the hydrogen-diluted diborane ($B_2H_6$: 1000 ppm) flow rate of $1\times10^{-3}$ l/min (1 sccm).

Figure 19D:
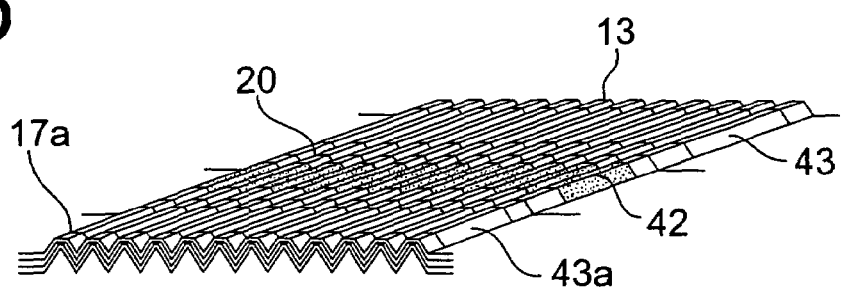

Next, a portion of the boron-doped diamond layer 17a was removed by means of etching, and the phosphorus-doped diamond layer 20 was exposed on the portion removed. Further, a portion of the exposed phosphorus-doped diamond layer 20 was removed by means of etching, and the single crystal p-type semiconductor {100} diamond substrate 13 was exposed on the portion removed. Further, as shown in FIG. 19D, Ti/Pt/Au ohmic electrodes 43a were formed on the boron-doped diamond layer 17a, Al ohmic electrodes 42 on the exposed phosphorus-doped diamond layer 20, and Ti/Pt/Au ohmic electrodes 43 on the exposed single crystal p-type semiconductor {100} diamond substrate 13.

Measurements of transistor property were carried out in connection with the single crystal p-type semiconductor {100} diamond substrate 13, the phosphorus-doped diamond layer 20 and the boron-doped diamond layer 17a, whereby good transistor properties were measured. It is hereby ascertained that the semiconductor diamond having a pnp junction structure (diamond transistor) was created.

Example 10

Figure 20A:
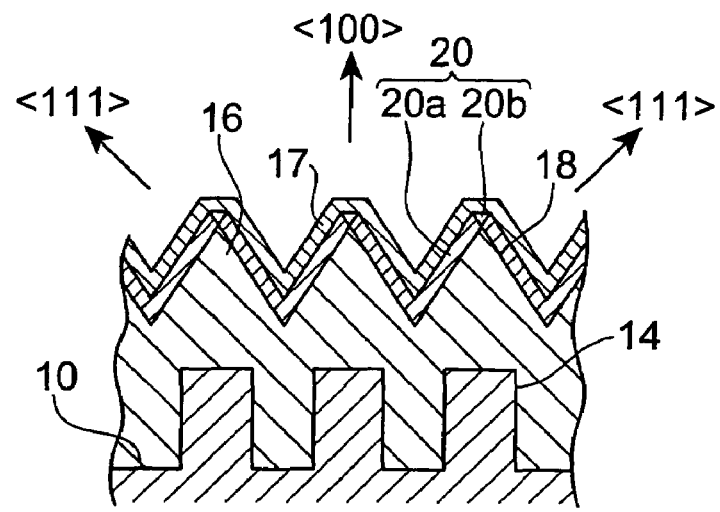
FIGS. 20A, 20B, and 20C are illustrations of an example of an npn junction type semiconductor diamond according to the invention.
Figure 20B:
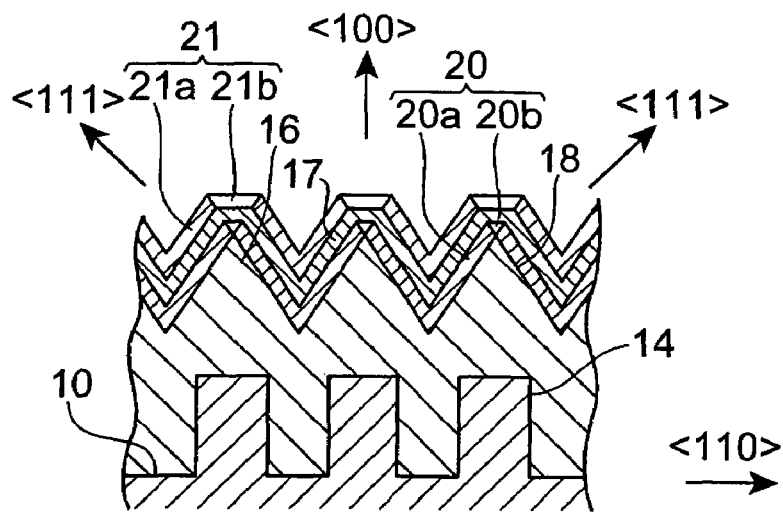
Figure 20C:
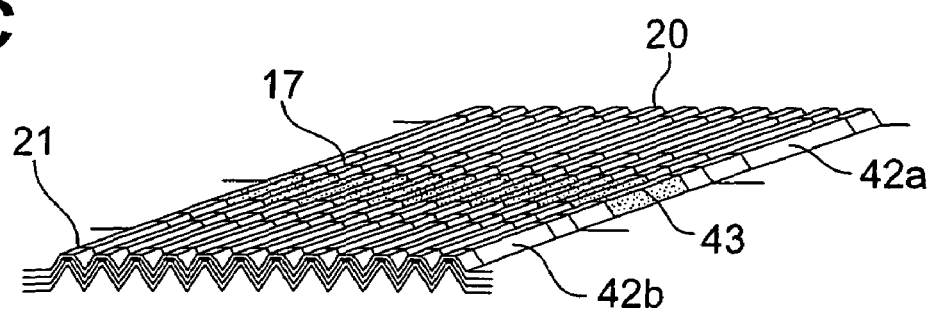

As shown in FIG. 20A, with the same method as in the seventh except the growth time of one hour pertaining to the boron-doped diamond synthesis condition, the phosphorus-doped diamond layer 20 (a first n-type diamond epitaxial layer) was formed on the single-crystalline {100} diamond substrate 10 with the rectangular 14 and triangular 18 protrusions formed thereon, and the boron-doped diamond layer 17 was formed on the phosphorus-doped diamond layer 20. Further, as shown in FIG. 20B, the phosphorus-doped diamond layer 21 (a second n-type diamond epitaxial layer) was formed on the boron-doped diamond layer 17 under the same phosphorus-doped diamond synthesis condition as in the third example except the hydrogen-diluted phosphine ($PH_3$: 1000 ppm) flow rate of $1\times10^{-2}$ l/min (10 sccm). This phosphorus-doped diamond layer 21 also was constituted by the <111> growth sector 21a and the <100> growth sector 21b.

Next, As is the case with the ninth example, by means of reactive ion etching, a portion of each of the boron-doped diamond layer 17 and the phosphorus-doped diamond layer 20 was exposed. Further, Al ohmic electrodes 42a were formed on the phosphorus-doped diamond layer 20, Ti/Pt/Au ohmic electrodes 43 on the boron-doped diamond layer 17, and Al ohmic electrodes 42b on the phosphorus-doped diamond layer 21. As is the case with the ninth example, transistor properties were measured, whereby good transistor properties were measured. It was hereby ascertained that the semiconductor diamond having an npn junction structure (diamond transistor) was created.

Example 11

Figure 21A:
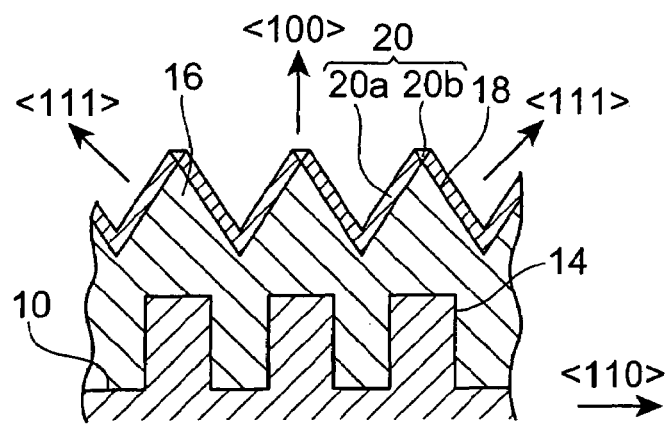
FIGS. 21A, 21B, 21C, and 21D are illustrations of an example of a pin junction type semiconductor diamond according to the invention.

As shown in FIG. 21A, the rectangular protrusions 14 were formed on the single-crystalline {100} diamond substrate 10 which was cut such that the orientations of the upper face and side faces were {100}, and the triangular protrusions 18 were formed on the rectangular protrusions 14. The method of forming the rectangular 14 and triangular 18 protrusions was the same as in the third example. The angle between these {111} planes and the substrate surface of the substrate 10 was measured to fall within the range of 55°±2°. Further, the phosphorus-doped diamond layer 20 was formed on the triangular protrusions 18 under the same phosphorus-doped diamond synthesis condition as in the third example.

Figure 21B:
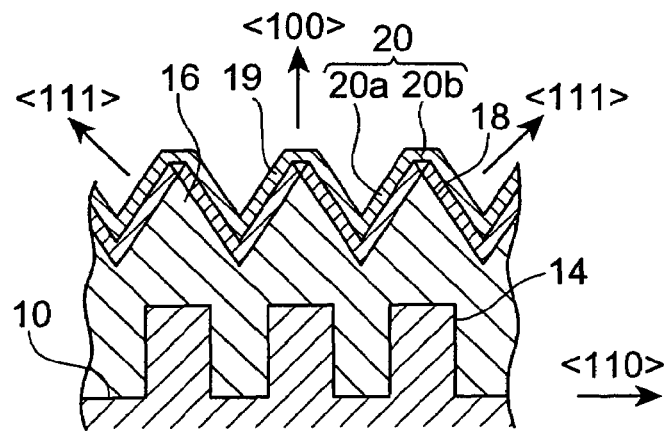

As shown in FIG. 21B, the non-doped diamond layer 19 was formed on the phosphorus-doped diamond layer 20. The synthesis condition for the non-doped diamond layer 19 was set as follows: hydrogen gas flow rate of 0.50 l/min (500 sccm); methane gas flow rate of $5\times10^{-4}$ l/min (0.5 sccm); pressure of $1.3\times10^4$ Pa; microwave power of 320 W; substrate temperature of 870° C.; and growth time of 10 min.

Figure 21C:
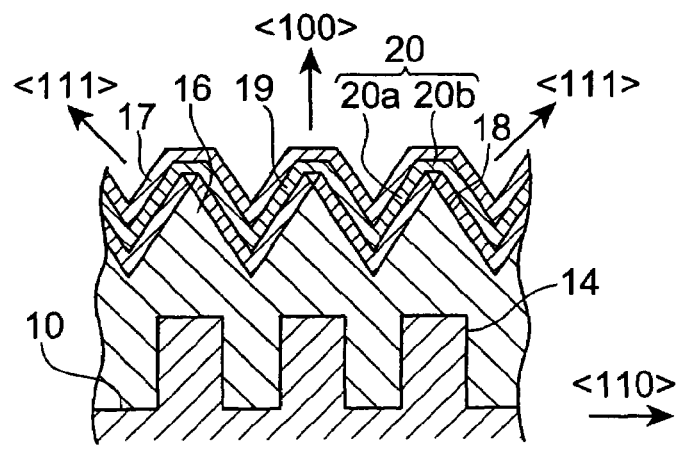
Figure 21D:
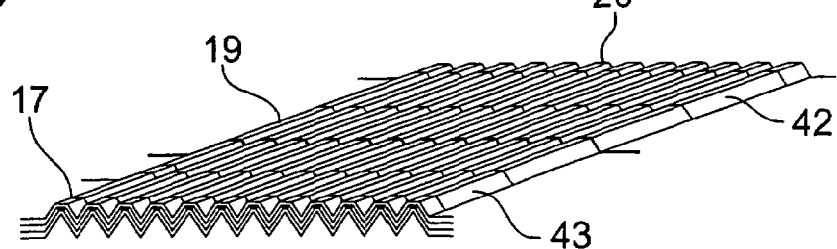

Further, on the non-doped diamond layer 19, as shown in FIG. 21C, the boron-doped diamond layer 17 was formed under the same boron-doped diamond synthesis condition as in the fifth example.

Next, a portion of the boron-doped 17 and non-doped 19 diamond layers was removed by means of reactive ion etching, and a portion of the phosphorus-doped diamond layer 20 was exposed. Further, Al ohmic electrodes 42 were formed on the phosphorus-doped diamond layer 20, and Ti/Pt/Au ohmic electrodes 43 on the boron-doped diamond layer 17. Further, the Ti/Pt/Au ohmic electrodes 43 were connected to the plus side of a DC source, and the Al ohmic electrodes 42 to the minus side, and voltage/current characteristics were measured.

As a result, a distinctive rectification property similar to that in the fifth example was observed. It was hereby ascertained that the semiconductor diamond having a pin junction structure (diamond pin junction diode) was created. It was further ascertained that this semiconductor diamond was diamond UV LED. It was yet further ascertained that this semiconductor diamond operates as diamond UV light detector.

As described above, according to the method of fabricating n-type semiconductor diamond according to the invention, a large-size high-quality high carrier density n-type semiconductor diamond can be obtained.

As for each of the pn junction type semiconductor diamond, pnp junction type semiconductor diamond, npn junction type semiconductor diamond, and pin junction type semiconductor diamond in accordance with this invention, the surface upon which the n-type diamond epitaxial layer is formed, is constituted as diamond {111} plane so allowing for a high n-doping efficiency. This in turn allows for formation of a high-quality high carrier density n-type diamond epitaxial layer. On the other hand, since there is used, as substrate, the single-crystalline {100} diamond substrate, which can be obtained as the one being of high quality and having a large surface area, a large-size high-quality semiconductor diamond can be obtained. This permits a low-cost semiconductor diamond to be realized.

FIELD OF THE INVENTION

This invention can be applied to a method of fabricating n-type semiconductor diamond; an n-type semiconductor diamond; a pn junction type semiconductor diamond; a pnp junction type semiconductor diamond; an npn junction type semiconductor diamond; and a pin junction type semiconductor diamond.

The invention claimed is:
1. An n-type semiconductor diamond, comprising:
   a single-crystalline {100} diamond substrate;
   a diamond layer formed on said single-crystalline {100} diamond substrate and having a plurality of diamond {111} planes; and
   an n-type diamond epitaxial layer formed on said diamond {111} surface and doped with n-dopant.

* * * * *